US007789961B2

(12) United States Patent
Nelson et al.

(10) Patent No.: US 7,789,961 B2
(45) Date of Patent: Sep. 7, 2010

(54) DELIVERY DEVICE COMPRISING GAS DIFFUSER FOR THIN FILM DEPOSITION

(75) Inventors: Shelby F. Nelson, Pittsford, NY (US); David H. Levy, Rochester, NY (US); Roger S. Kerr, Brockport, NY (US)

(73) Assignee: Eastman Kodak Company, Rochester, NY (US)

( * ) Notice: Subject to any disclaimer, the term of this patent is extended or adjusted under 35 U.S.C. 154(b) by 910 days.

(21) Appl. No.: 11/620,740

(22) Filed: Jan. 8, 2007

(65) Prior Publication Data
US 2008/0166884 A1 Jul. 10, 2008

(51) Int. Cl.
C23C 16/455 (2006.01)
C23F 1/00 (2006.01)
H01L 21/306 (2006.01)
C23C 16/06 (2006.01)
C23C 16/22 (2006.01)

(52) U.S. Cl. ........................ 118/715; 118/718; 118/729; 156/345.29; 156/345.33; 156/345.34; 156/345.54

(58) Field of Classification Search ................. 118/715, 118/718, 729; 156/345.29, 345.33, 345.34, 156/345.54
See application file for complete search history.

(56) References Cited

U.S. PATENT DOCUMENTS

| 4,413,022 | A | | 11/1983 | Suntola et al. | |
|---|---|---|---|---|---|
| 4,590,042 | A | * | 5/1986 | Drage | 422/186.06 |
| 5,284,519 | A | * | 2/1994 | Gadgil | 118/719 |
| 5,380,396 | A | * | 1/1995 | Shikida et al. | 216/2 |
| 5,422,139 | A | * | 6/1995 | Fischer | 427/248.1 |
| 5,589,002 | A | * | 12/1996 | Su | 118/723 E |
| 5,958,140 | A | * | 9/1999 | Arami et al. | 118/725 |
| 6,289,842 | B1 | * | 9/2001 | Tompa | 118/723 E |
| 6,432,831 | B2 | * | 8/2002 | Dhindsa et al. | 438/710 |
| 6,793,733 | B2 | * | 9/2004 | Janakiraman et al. | 118/715 |
| 6,821,563 | B2 | * | 11/2004 | Yudovsky | 427/248.1 |
| 6,830,071 | B2 | * | 12/2004 | Xu et al. | 137/625.33 |
| 6,890,386 | B2 | * | 5/2005 | DeDontney et al. | 118/715 |
| 7,456,429 | B2 | * | 11/2008 | Levy | 257/66 |
| 7,481,886 | B2 | * | 1/2009 | Kato et al. | 118/715 |
| 7,572,686 | B2 | * | 8/2009 | Levy et al. | 438/149 |
| 7,601,223 | B2 | * | 10/2009 | Lindfors et al. | 118/715 |
| 2003/0027431 | A1 | * | 2/2003 | Sneh et al. | 438/758 |
| 2004/0067641 | A1 | * | 4/2004 | Yudovsky | 438/680 |

(Continued)

FOREIGN PATENT DOCUMENTS

EP 0 473 040 3/1992

(Continued)

*Primary Examiner*—Rudy Zervigon
(74) *Attorney, Agent, or Firm*—Chris P. Konkol; J. Lanny Tucker

(57) ABSTRACT

A process for depositing a thin film material on a substrate is disclosed, comprising simultaneously directing a series of gas flows from the output face of a delivery head of a thin film deposition system toward the surface of a substrate, and wherein the series of gas flows comprises at least a first reactive gaseous material, an inert purge gas, and a second reactive gaseous material, wherein the first reactive gaseous material is capable of reacting with a substrate surface treated with the second reactive gaseous material. A system capable of carrying out such a process is also disclosed.

47 Claims, 31 Drawing Sheets

U.S. PATENT DOCUMENTS

| | | | |
|---|---|---|---|
| 2004/0250768 A1* | 12/2004 | Kikuchi et al. | 118/715 |
| 2005/0103265 A1* | 5/2005 | Gianoulakis et al. | 118/715 |
| 2006/0234514 A1* | 10/2006 | Gianoulakis et al. | 438/758 |
| 2008/0166880 A1* | 7/2008 | Levy | 438/758 |
| 2008/0166884 A1* | 7/2008 | Nelson et al. | 438/765 |
| 2009/0078204 A1* | 3/2009 | Kerr et al. | 118/728 |
| 2009/0079328 A1* | 3/2009 | Fedorovskaya et al. | 313/504 |
| 2009/0081366 A1* | 3/2009 | Kerr et al. | 427/255.28 |
| 2009/0081886 A1* | 3/2009 | Levy et al. | 438/790 |
| 2009/0095222 A1* | 4/2009 | Tam et al. | 118/723 R |
| 2009/0130858 A1* | 5/2009 | Levy | 438/765 |
| 2009/0217878 A1* | 9/2009 | Levy et al. | 118/729 |

FOREIGN PATENT DOCUMENTS

| | | |
|---|---|---|
| EP | 1 361 604 | 11/2003 |
| WO | 2006/091448 | 8/2006 |

* cited by examiner

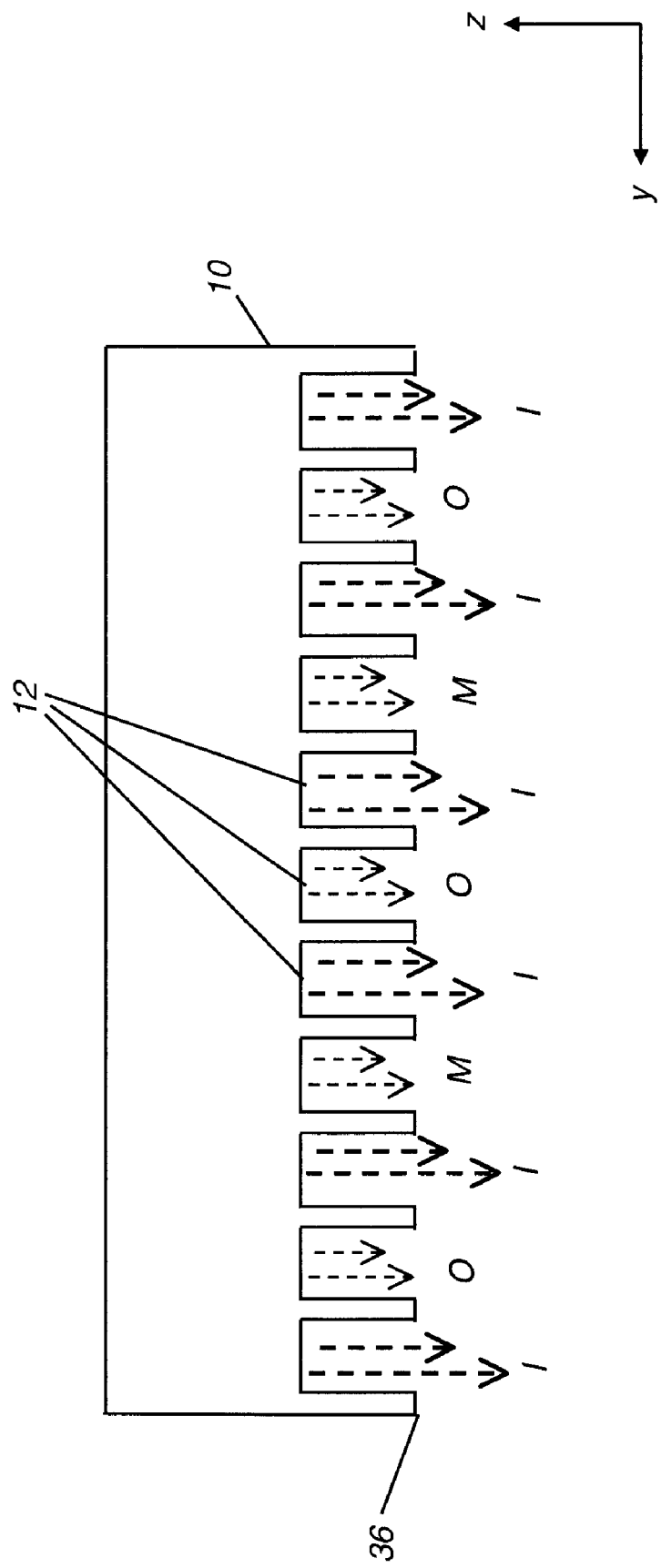

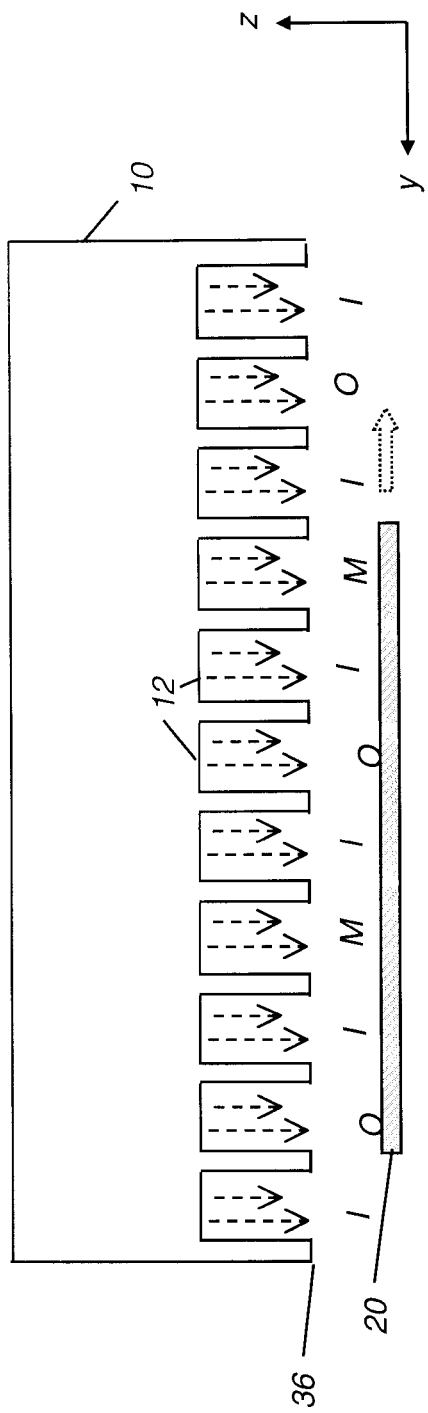
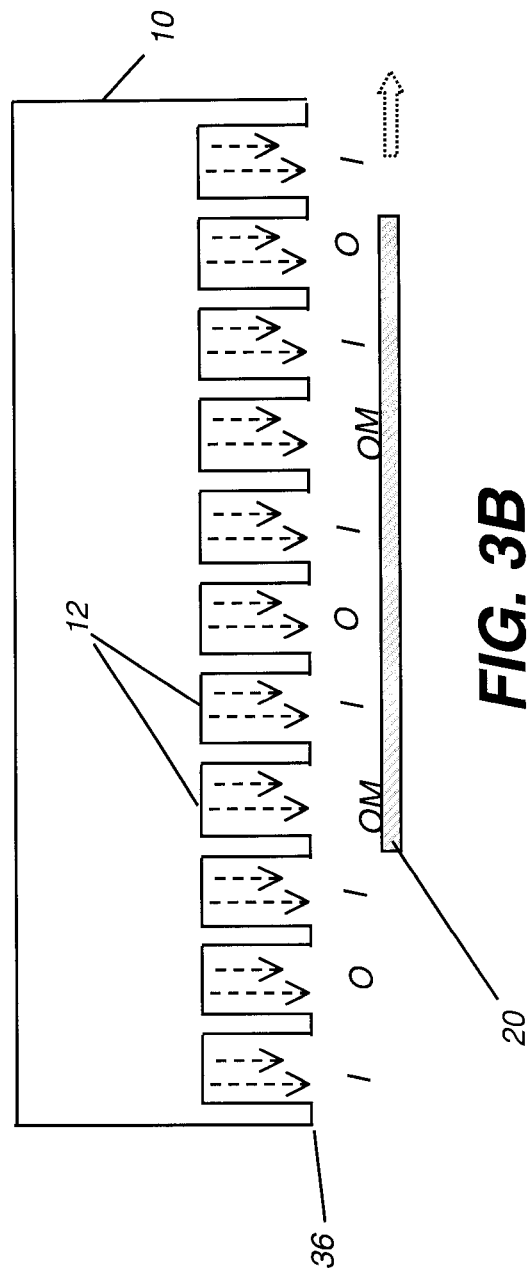
*FIG. 3A*
*FIG. 3B*

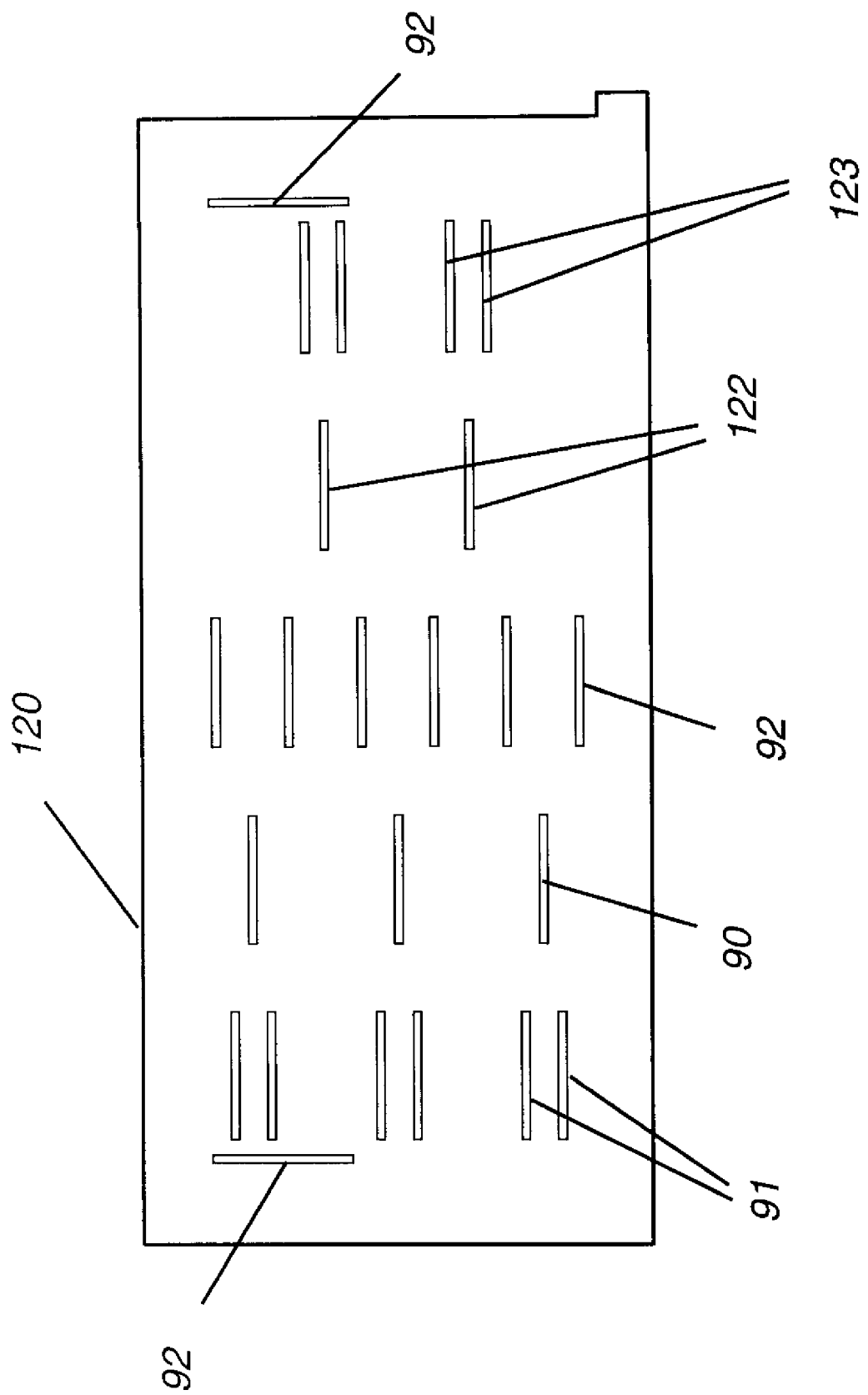

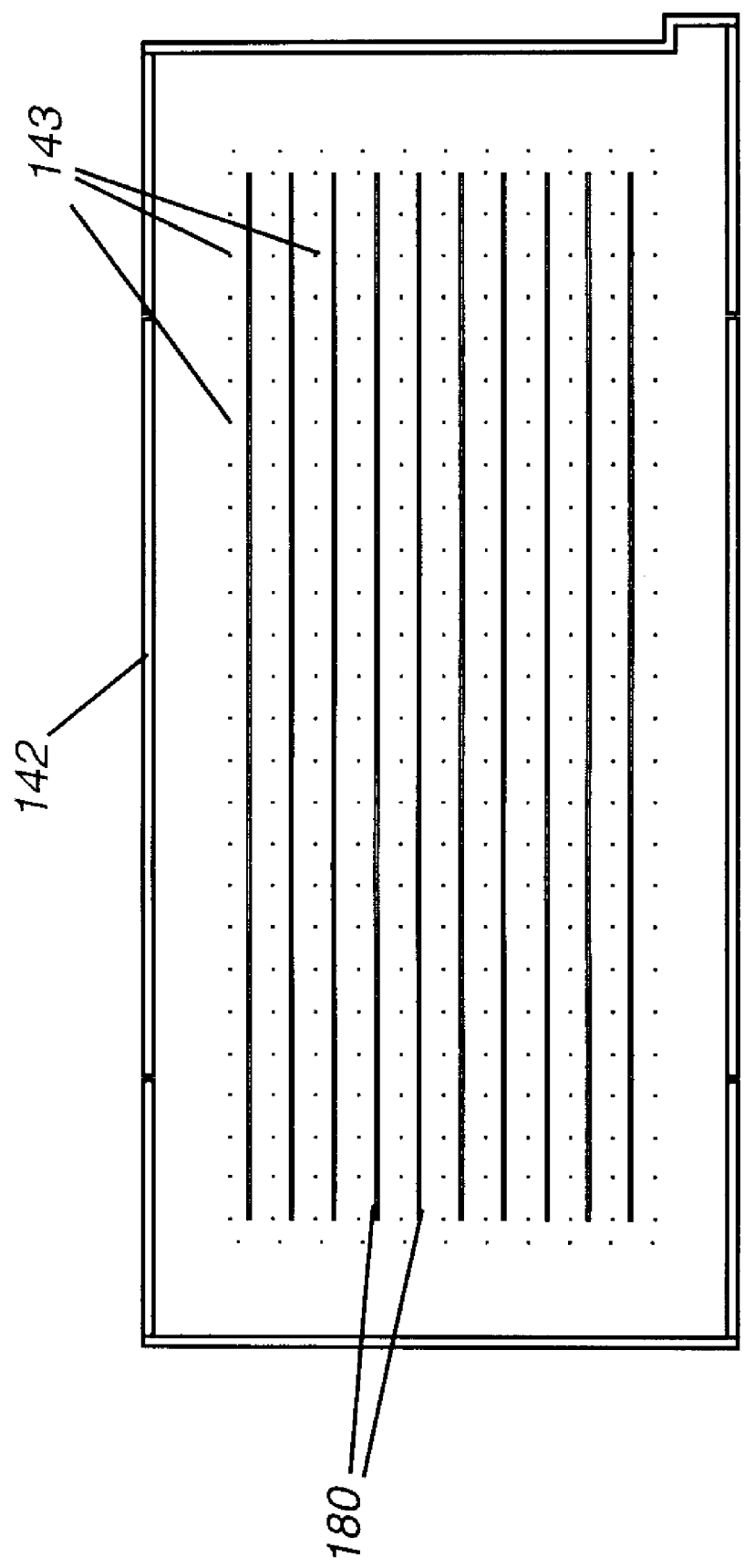

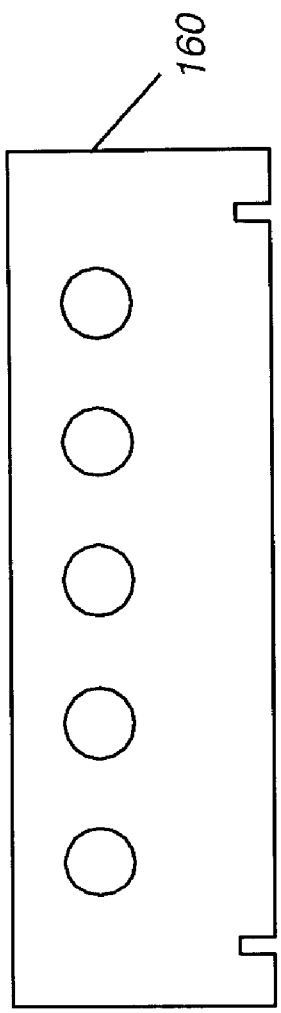
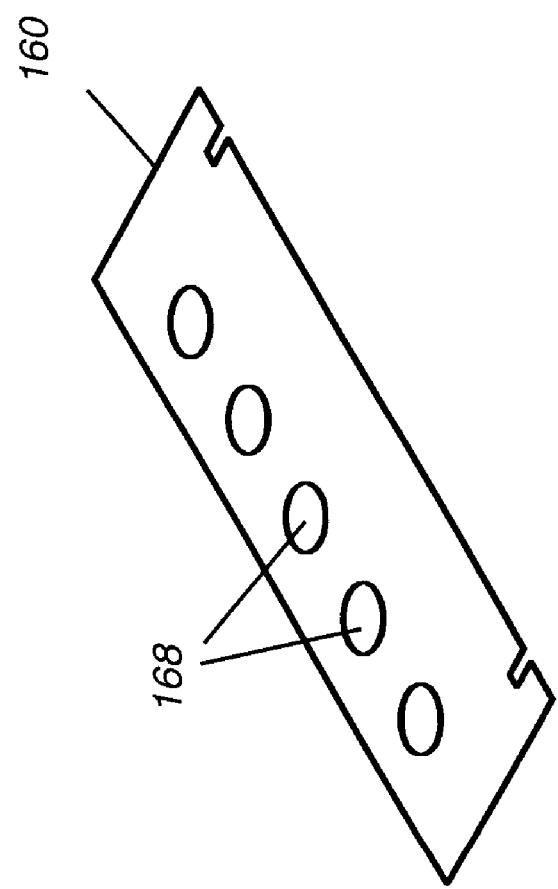
FIG. 10A
FIG. 10B

DELIVERY DEVICE COMPRISING GAS DIFFUSER FOR THIN FILM DEPOSITION

CROSS-REFERENCE TO RELATED APPLICATIONS

The present application is related to U.S. application Ser. No. 11/392,007, filed Mar. 29, 2006 by Levy et al. and entitled, "PROCESS FOR ATOMIC LAYER DEPOSITION," U.S. application Ser. No. 11/392,006, filed Mar. 29, 2006 by Levy et al. and entitled "APPARATUS FOR ATOMIC LAYER DEPOSITION," U.S. application Ser. No. 11/620,744, filed concurrently by Levy et al. and entitled "DEPOSITION SYSTEM AND METHOD USING A DELIVERY HEAD SEPARATED FROM A SUBSTRATE BY GAS PRESSURE," and U.S. application Ser. No. 11/620,738, filed concurrently by Levy et al. and entitled "DELIVERY DEVICE FOR DEPOSITION," all four identified applications incorporated by reference in their entirety.

FIELD OF THE INVENTION

This invention generally relates to the deposition of thin-film materials and, more particularly, to apparatus for atomic layer deposition onto a substrate using a distribution head directing simultaneous gas flows onto a substrate.

BACKGROUND OF THE INVENTION

Among the techniques widely used for thin-film deposition is Chemical Vapor Deposition (CVD) that uses chemically reactive molecules that react in a reaction chamber to deposit a desired film on a substrate. Molecular precursors useful for CVD applications comprise elemental (atomic) constituents of the film to be deposited and typically also include additional elements. CVD precursors are volatile molecules that are delivered, in a gaseous phase, to a chamber in order to react at the substrate, forming the thin film thereon. The chemical reaction deposits a thin film with a desired film thickness.

Common to most CVD techniques is the need for application of a well-controlled flux of one or more molecular precursors into the CVD reactor. A substrate is kept at a well-controlled temperature under controlled pressure conditions to promote chemical reaction between these molecular precursors, concurrent with efficient removal of byproducts. Obtaining optimum CVD performance requires the ability to achieve and sustain steady-state conditions of gas flow, temperature, and pressure throughout the process, and the ability to minimize or eliminate transients.

Especially in the field of semiconductor, integrated circuit, and other electronic devices, there is a demand for thin films, especially higher quality, denser films, with superior conformal coating properties, beyond the achievable limits of conventional CVD techniques, especially thin films that can be manufactured at lower temperatures.

Atomic layer deposition ("ALD") is an alternative film deposition technology that can provide improved thickness resolution and conformal capabilities, compared to its CVD predecessor. The ALD process segments the conventional thin-film deposition process of conventional CVD into single atomic-layer deposition steps. Advantageously, ALD steps are self-terminating and can deposit one atomic layer when conducted up to or beyond self-termination exposure times. An atomic layer typically ranges from about 0.1 to about 0.5 molecular monolayers, with typical dimensions on the order of no more than a few Angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the absence of the other precursor or precursors of the reaction. In practice, in any system it is difficult to avoid some direct reaction of the different precursors leading to a small amount of chemical vapor deposition reaction. The goal of any system claiming to perform ALD is to obtain device performance and attributes commensurate with an ALD system while recognizing that a small amount of CVD reaction can be tolerated.

In ALD applications, typically two molecular precursors are introduced into the ALD reactor in separate stages. For example, a metal precursor molecule, $ML_x$, comprises a metal element, M that is bonded to an atomic or molecular ligand, L. For example, M could be, but would not be restricted to, Al, W, Ta, Si, Zn, etc. The metal precursor reacts with the substrate when the substrate surface is prepared to react directly with the molecular precursor. For example, the substrate surface typically is prepared to include hydrogen-containing ligands, AH or the like, that are reactive with the metal precursor. Sulfur (S), oxygen (O), and Nitrogen (N) are some typical A species. The gaseous metal precursor molecule effectively reacts with all of the ligands on the substrate surface, resulting in deposition of a single atomic layer of the metal:

$$\text{substrate-}AH + ML_x \rightarrow \text{substrate-}AML_{x-1} + HL \quad (1)$$

where HL is a reaction by-product. During the reaction, the initial surface ligands, AH, are consumed, and the surface becomes covered with L ligands, which cannot further react with metal precursor $ML_x$. Therefore, the reaction self-terminates when all of the initial AH ligand on the surface are replaced with $AML_{x-1}$ species. The reaction stage is typically followed by an inert-gas purge stage that eliminates the excess metal precursor from the chamber prior to the separate introduction of a second reactant gaseous precursor material.

The second molecular precursor then is used to restore the surface reactivity of the substrate towards the metal precursor. This is done, for example, by removing the L ligands and redepositing AH ligands. In this case, the second precursor typically comprises the desired (usually nonmetallic) element A (i.e., O, N, S), and hydrogen (i.e., $H_2O$, $NH_3$, $H_2S$). The next reaction is as follows:

$$\text{substrate-}A\text{-}ML + AH_Y \rightarrow \text{substrate-}A\text{-}M\text{-}AH + HL \quad (2)$$

This converts the surface back to its AH-covered state. (Here, for the sake of simplicity, the chemical reactions are not balanced.) The desired additional element, A, is incorporated into the film and the undesired ligands, L, are eliminated as volatile by-products. Once again, the reaction consumes the reactive sites (this time, the L terminated sites) and self-terminates when the reactive sites on the substrate are entirely depleted. The second molecular precursor then is removed from the deposition chamber by flowing inert purge-gas in a second purge stage.

In summary, then, the basic ALD process requires alternating, in sequence, the flux of chemicals to the substrate. The representative ALD process, as discussed above, is a cycle having four different operational stages:

1. $ML_x$ reaction;

2. $ML_x$ purge;

3. $AH_y$ reaction; and

4. $AH_y$ purge, and then back to stage 1.

This repeated sequence of alternating surface reactions and precursor-removal that restores the substrate surface to its initial reactive state, with intervening purge operations, is a typical ALD deposition cycle. A key feature of ALD operation is the restoration of the substrate to its initial surface chemistry condition. Using this repeated set of steps, a film can be layered onto the substrate in equal metered layers that are all alike in chemical kinetics, deposition per cycle, composition, and thickness.

ALD can be used as a fabrication step for forming a number of types of thin-film electronic devices, including semiconductor devices and supporting electronic components such as resistors and capacitors, insulators, bus lines and other conductive structures. ALD is particularly suited for forming thin layers of metal oxides in the components of electronic devices. General classes of functional materials that can be deposited with ALD include conductors, dielectrics or insulators, and semiconductors.

Conductors can be any useful conductive material. For example, the conductors may comprise transparent materials such as indium-tin oxide (ITO), doped zinc oxide ZnO, $SnO_2$, or $In_2O_3$. The thickness of the conductor may vary, and according to particular examples it can range from about 50 to about 1000 nm.

Examples of useful semiconducting materials are compound semiconductors such as gallium arsenide, gallium nitride, cadmium sulfide, intrinsic zinc oxide, and zinc sulfide.

A dielectric material electrically insulates various portions of a patterned circuit. A dielectric layer may also be referred to as an insulator or insulating layer. Specific examples of materials useful as dielectrics include strontiates, tantalates, titanates, zirconates, aluminum oxides, silicon oxides, tantalum oxides, hafnium oxides, titanium oxides, zinc selenide, and zinc sulfide. In addition, alloys, combinations, and multilayers of these examples can be used as dielectrics. Of these materials, aluminum oxides are preferred.

A dielectric structure layer may comprise two or more layers having different dielectric constants. Such insulators are discussed in U.S. Pat. No. 5,981,970 hereby incorporated by reference and copending U.S. application Ser. No. 11/088,645, hereby incorporated by reference. Dielectric materials typically exhibit a band-gap of greater than about 5 eV. The thickness of a useful dielectric layer may vary, and according to particular examples it can range from about 10 to about 300 nm.

A number of device structures can be made with the functional layers described above. A resistor can be fabricated by selecting a conducting material with moderate to poor conductivity. A capacitor can be made by placing a dielectric between two conductors. A diode can be made by placing two semiconductors of complementary carrier type between two conducting electrodes. There may also be disposed between the semiconductors of complementary carrier type a semiconductor region that is intrinsic, indicating that that region has low numbers of free charge carriers. A diode may also be constructed by placing a single semiconductor between two conductors, where one of the conductor/semiconductors interfaces produces a Schottky barrier that impedes current flow strongly in one direction. A transistor may be made by placing upon a conductor (the gate) an insulating layer followed by a semiconducting layer. If two or more additional conductor electrodes (source and drain) are placed spaced apart in contact with the top semiconductor layer, a transistor can be formed. Any of the above devices can be created in various configurations as long as the necessary interfaces are created.

In typical applications of a thin film transistor, the need is for a switch that can control the flow of current through the device. As such, it is desired that when the switch is turned on a high current can flow through the device. The extent of current flow is related to the semiconductor charge carrier mobility. When the device is turned off, it is desirable that the current flow be very small. This is related to the charge carrier concentration. Furthermore, it is generally preferable that visible light have little or no influence on thin-film transistor response. In order for this to be true, the semiconductor band gap must be sufficiently large (>3 eV) so that exposure to visible light does not cause an inter-band transition. A material that is capable of yielding a high mobility, low carrier concentration, and high band gap is ZnO. Furthermore, for high-volume manufacture onto a moving web, it is highly desirable that chemistries used in the process be both inexpensive and of low toxicity, which can be satisfied by the use of ZnO and the majority of its precursors.

Self-saturating surface reactions make ALD relatively insensitive to transport non-uniformities, which might otherwise impair surface uniformity, due to engineering tolerances and the limitations of the flow system or related to surface topography (that is, deposition into three dimensional, high aspect ratio structures). As a general rule, a non-uniform flux of chemicals in a reactive process generally results in different completion times over different portions of the surface area. However, with ALD, each of the reactions is allowed to complete on the entire substrate surface. Thus, differences in completion kinetics impose no penalty on uniformity. This is because the areas that are first to complete the reaction self-terminate the reaction; other areas are able to continue until the full treated surface undergoes the intended reaction.

Typically, an ALD process deposits about 0.1-0.2 nm of a film in a single ALD cycle (with one cycle having numbered steps 1 through 4 as listed earlier). A useful and economically feasible cycle time must be achieved in order to provide a uniform film thickness in a range of about from 3 nm to 30 nm for many or most semiconductor applications, and even thicker films for other applications. According to industry throughput standards, substrates are preferably processed within 2 minutes to 3 minutes, which means that ALD cycle times must be in a range from about 0.6 seconds to about 6 seconds.

ALD offers considerable promise for providing a controlled level of highly uniform thin film deposition. However, in spite of its inherent technical capabilities and advantages, a number of technical hurdles still remain. One important consideration relates to the number of cycles needed. Because of its repeated reactant and purge cycles, effective use of ALD has required an apparatus that is capable of abruptly changing the flux of chemicals from $ML_x$ to $AH_y$, along with quickly performing purge cycles. Conventional ALD systems are designed to rapidly cycle the different gaseous substances onto the substrate in the needed sequence. However, it is difficult to obtain a reliable scheme for introducing the needed series of gaseous formulations into a chamber at the needed speeds and without some unwanted mixing. Furthermore, an ALD apparatus must be able to execute this rapid sequencing efficiently and reliably for many cycles in order to allow cost-effective coating of many substrates.

In an effort to minimize the time that an ALD reaction needs to reach self-termination, at any given reaction temperature, one approach has been to maximize the flux of chemicals flowing into the ALD reactor, using so-called "pulsing" systems. In order to maximize the flux of chemicals into the ALD reactor, it is advantageous to introduce the molecular precursors into the ALD reactor with minimum dilution of inert gas and at high pressures. However, these measures work against the need to achieve short cycle times and the rapid removal of these molecular precursors from the ALD reactor. Rapid removal in turn dictates that gas residence time in the ALD reactor be minimized. Gas residence times, τ, are proportional to the volume of the reactor, V, the pressure, P, in the ALD reactor, and the inverse of the flow, Q, that is:

$$\tau = VP/Q \qquad (3)$$

In a typical ALD chamber, the volume (V) and pressure (P) are dictated independently by the mechanical and pumping constraints, leading to difficulty in precisely controlling the residence time to low values. Accordingly, lowering pressure (P) in the ALD reactor facilitates low gas residence times and increases the speed of removal (purge) of chemical precursor from the ALD reactor. In contrast, minimizing the ALD reaction time requires maximizing the flux of chemical precursors into the ALD reactor through the use of a high pressure within the ALD reactor. In addition, both gas residence time and chemical usage efficiency are inversely proportional to the flow. Thus, while lowering flow can increase efficiency, it also increases gas residence time.

Existing ALD approaches have been compromised with the trade-off between the need to shorten reaction times with improved chemical utilization efficiency, and, on the other hand, the need to minimize purge-gas residence and chemical removal times. One approach to overcome the inherent limitations of "pulsed" delivery of gaseous material is to provide each reactant gas continuously and to move the substrate through each gas in succession. For example, U.S. Pat. No. 6,821,563 entitled "GAS DISTRIBUTION SYSTEM FOR CYCLICAL LAYER DEPOSITION" to Yudovsky describes a processing chamber, under vacuum, having separate gas ports for precursor and purge gases, alternating with vacuum pump ports between each gas port. Each gas port directs its stream of gas vertically downward toward a substrate. The separate gas flows are separated by walls or partitions, with vacuum, pumps for evacuating gas on both sides of each gas stream. A lower portion of each partition extends close to the substrate, for example, about 0.5 mm or greater from the substrate surface. In this manner, the lower portions of the partitions are separated from the substrate surface by a distance sufficient to allow the gas streams to flow around the lower portions toward the vacuum ports after the gas streams react with the substrate surface.

A rotary turntable or other transport device is provided for holding one or more substrate wafers. With this arrangement, the substrate is shuttled beneath the different gas streams, effecting ALD deposition thereby. In one embodiment, the substrate is moved in a linear path through a chamber, in which the substrate is passed back and forth a number of times.

Another approach using continuous gas flow is shown in U.S. Pat. No. 4,413,022 entitled "METHOD FOR PERFORMING GROWTH OF COMPOUND THIN FILMS" to Suntola et al. A gas flow array is provided with alternating source gas openings, carrier gas openings, and vacuum exhaust openings. Reciprocating motion of the substrate over the array effects ALD deposition, again, without the need for pulsed operation. In the embodiment of FIGS. 13 and 14, in particular, sequential interactions between a substrate surface and reactive vapors are made by a reciprocating motion of the substrate over a fixed array of source openings. Diffusion barriers are formed by having a carrier gas opening between exhaust openings. Suntola et al. state that operation with such an embodiment is possible even at atmospheric pressure, although little or no details of the process, or examples, are provided.

While systems such as those described in the '563 Yudovsky and '022 Suntola et al. disclosures may avoid some of the difficulties inherent to pulsed gas approaches, these systems have other drawbacks. Neither the gas flow delivery unit of the '563 Yudovsky disclosure nor the gas flow array of the '022 Suntola et al. disclosure can be used in closer proximity to the substrate than about 0.5 mm. Neither of the gas flow delivery apparatus disclosed in the '563 Yudovsky and '022 Suntola et al. patents are arranged for possible use with a moving web surface, such as could be used as a flexible substrate for forming electronic circuits, light sensors, or displays, for example. The complex arrangements of both the gas flow delivery unit of the '563 Yudovsky disclosure and the gas flow array of the '022 Suntola et al. disclosure, each providing both gas flow and vacuum, make these solutions difficult to implement and costly to scale and limit their potential usability to deposition applications onto a moving substrate of limited dimensions. Moreover, it would be very difficult to maintain a uniform vacuum at different points in an array and to maintain synchronous gas flow and vacuum at complementary pressures, thus compromising the uniformity of gas flux that is provided to the substrate surface.

U.S. patent Pub. No. 2005/0084610 to Selitser discloses an atmospheric pressure atomic layer chemical vapor deposition process. Selitser et al. state that extraordinary increases in reaction rates are obtained by changing the operating pressure to atmospheric pressure, which will involve orders of magnitude increase in the concentration of reactants, with consequent enhancement of surface reactant rates. The embodiments of Selitser et al. involve separate chambers for each stage of the process, although FIG. 10 in 2005/0084610 shows an embodiment in which chamber walls are removed. A series of separated injectors are spaced around a rotating circular substrate holder track. Each injector incorporates independently operated reactant, purging, and exhaust gas manifolds and controls and acts as one complete mono-layer deposition and reactant purge cycle for each substrate as is passes there under in the process. Little or no specific details of the gas injectors or manifolds are described by Selitser et al., although they state that spacing of the injectors is selected so that cross-contamination from adjacent injectors is prevented by purging gas flows and exhaust manifolds incorporate in each injector.

Typical diffuser systems for gases will diffuse gases isotropically. Considering the design of a coating head, that may be beneficial by providing flow uniformity. In an ALD system such as in '563 Yudovsky, however, such diffusion would allow gases to diffuse laterally, which would disadvantageously cause reaction between neighboring gas streams.

ALD processing devices such as described above and the transverse-flow ALD device of the above-cited U.S. Ser. No. 11/392,006 and the floating-head ALD device of the above-cited U.S. Ser. No. 11/620,738 all provide for the spatial separation of mutually reactive gases. The efficiency of these devices is further improved by placing these gases in relatively close proximity, but still not allowing them to mix due one or more of factors such as the presence of purge streams, and the use of particular flow patterns. When attempting to have these gases in close proximity, it is important to deliver gases is a relatively precise way, with good uniformity over the dimensions of a delivery head.

OBJECT OF THE INVENTION

An object of the present invention is, when placing reactive gases in close proximity in an ALD coating process, to deliver gases in a relatively precise way, with good uniformity over the dimensions of a delivery head.

Another object of the present invention is to diffuse the gases while maintaining channel separation during simultaneous gas flow.

Another object is, in providing this uniformity, to produce a uniform backpressure over an extended area of an output channel, thus diffusing the flow of the gas.

Another object is to provide efficient and easy-to-assemble diffuser systems for a delivery head.

Another object is to provide an ALD deposition method and apparatus that can be used with a continuous process and that can provide improved gas flow separation over earlier solutions.

Another object is to provide an ALD deposition method and apparatus that is more robust to potential disturbances or irregularities in process conditions or circumstances during operation.

Another object is to provide, in embodiments that use a floating delivery head, an ALD deposition method and apparatus that advantageously provides improved mobility.

SUMMARY OF THE INVENTION

The present invention provides an apparatus and process for depositing a thin film material on a substrate, comprising simultaneously directing a series of gas flows from the output face of a delivery head of a thin film deposition system toward the surface of a substrate, wherein the series of gas flows comprises at least a first reactive gaseous material, an inert purge gas, and a second reactive gaseous material. The first reactive gaseous material is capable of reacting with a substrate surface treated with the second reactive gaseous material. In particular, the present invention relates to a delivery device for thin-film material deposition onto a substrate comprising:

A delivery device for thin-film material deposition onto a substrate comprising:

(a) a plurality of inlet ports comprising at least a first inlet port, a second inlet port, and a third inlet port capable of receiving a common supply for a first gaseous material, a second gaseous material, and a third gaseous material, respectively;

(b) at least one exhaust port capable of receiving exhaust gas from thin-film material deposition and at least two elongated exhaust channels, each of the elongated exhaust channels capable of gaseous fluid communication with the at least one exhaust port;

(c) at least three groups of elongated emissive channels, (i) a first group comprising one or more first elongated emissive channels, (ii) a second group comprising one or more second elongated emissive channels, and (iii) a third group comprising at least two third elongated emissive channels, each of the first, second, and third elongated emissive channels capable of gaseous fluid communication, respectively, with one of the corresponding first inlet port, second inlet port, and third inlet port;

wherein each of the first, second, and third elongated emissive channels and each of the elongated exhaust channels extend in a length direction substantially in parallel;

wherein each first elongated emissive channel is separated on at least one elongated side thereof from a nearest second elongated emissive channel by a relatively nearer elongated exhaust channel and a relatively less near third elongated emissive channel;

wherein each first elongated emissive channel and each second elongated emissive channel is situated between relatively nearer elongated exhaust channels and between relatively less nearer elongated emissive channels; and (d) a gas diffuser associated with at least one group of the three groups of elongated emissive channels such that at least one of the first, second, and third gaseous material, respectively, is capable of passing through the gas diffuser prior to delivery from the delivery device to the substrate, during thin-film material deposition onto the substrate, and wherein the gas diffuser maintains flow isolation of the at least one of first, second, and third gaseous material downstream from each of the elongated emissive channels in the at least one group of elongated emissive channels.

Thus, the delivery device can comprise a single first elongated emissive channel, a single second elongated emissive channel, and two or more third elongated emissive channels, although a plurality (two or more) of each are preferred, as described below. Accordingly the term "group" can comprise a single member.

Preferably, the delivery head comprises a plurality of first elongated emissive channels and/or a plurality of second elongated emissive channels for various applications. However, as a minimum, a one-stage delivery head can have, for example, only one metal and or one oxidizer channel in combination with at least two purge channels. A plurality of individual "delivery-head sub-units" that are connected together, or that are transported in sync during thin-film deposition onto a substrate, or that treat the same substrate during a common period of time are considered a "delivery head" for the purpose of the present invention, even though separately constructed or separable after deposition.

In a preferred embodiment, the first and second gaseous materials can be mutually reactive gases, and the third gaseous material can be a purge gas such as nitrogen.

In one particularly advantageous aspect of the invention, the gas diffuser is capable of providing a friction factor that is greater than $1\times10^2$, assuming a representative gas that is nitrogen at 25° C. and a representative average velocity between 0.01 and 0.5 m/sec of gaseous material passing through the gas diffuser.

In one embodiment of the invention, the gas diffuser comprises a porous material through which the at least one of the first, second, and third gaseous material passes.

In a second embodiment of the invention, the gas diffuser comprises a mechanically formed assembly comprising at least two elements, each comprising a substantially parallel surface area facing each other, each element comprising interconnected passages each in fluid communication with one of the individual elongated emissive channels among the at least one group of elongated emissive channels, wherein the gas diffuser deflects gaseous material passing therethough by providing two substantially vertical flow paths for gaseous material separated by a substantially horizontal flow path for gaseous material, wherein the substantially vertical flow path is provided by one or more passages extending in an elongated direction and wherein the substantially horizontal flow path is provided by a thin space between the parallel surface areas in the two elements, wherein vertical refers to the orthogonal direction with respect to the output face of the delivery device.

In a preferred embodiment, the gas diffuser is associated with each of the three groups of elongated emissive channels such that each of the firs, second, and third gaseous material, respectively, is capable of separately passing from the delivery device to the substrate during thin-film material deposition on the substrate, and wherein the gas diffuser maintains flow isolation of each of first, second, and third gaseous material downstream from each of the elongated emissive channels in the three groups of elongated emissive channels.

Another aspect of the present invention relates to a deposition system wherein the above-described delivery device is capable of providing thin film deposition of a solid material onto a substrate in a system in which a substantially uniform distance is maintained between the output face of the delivery head and the substrate surface during thin film deposition.

Yet another aspect of the present invention relates to a process for depositing a thin film material on a substrate, comprising simultaneously directing a series of gas flows from the output face of a delivery head toward the surface of a substrate, wherein the series of gas flows comprises at least a first reactive gaseous material, an inert purge gas, and a second reactive gaseous material, and wherein the first reactive gaseous material is capable of reacting with a substrate surface treated with the second reactive gaseous material. The delivery head comprises a gas diffuser element through which passes at least one of (preferably all three of) the first reactive gaseous material, the inert purge gas, and the second reactive gaseous material while maintaining flow isolation of the at one gaseous material. Advantageously, the gas diffuser provides a friction factor for gaseous material passing therethrough that is greater than $1 \times 10^2$, thereby providing back pressure and promoting equalization of pressure where the flow of the at least one first, second and third gaseous material exits the delivery device.

The friction factor assumes that the characteristic friction factor area is equal to the entire area between exhaust elongated channels on either side of each emissive elongated channel of said at least one group of emissive elongated channels, thereby providing back pressure and promoting the equalization of pressure where the flow of the at least one first, second and third gaseous material exits the delivery device.

In one preferred embodiment, one or more of the gas flows provides a pressure that at least contributes to the separation of the surface of the substrate from the face of the delivery head.

In another embodiment, the system provides a relative oscillating motion between the distribution head and the substrate. In a preferred embodiment, the system can be operated with continuous movement of a substrate being subjected to thin film deposition, wherein the system is capable of conveying the support on or as a web past the distribution head, preferably in an unsealed environment to ambient at substantially atmospheric pressure.

It is an advantage of the present invention that it can provide a compact apparatus for atomic layer deposition onto a substrate that is well suited to a number of different types of substrates and deposition environments.

It is a further advantage of the present invention that it allows operation, in preferred embodiments, under atmospheric pressure conditions.

It is yet a further advantage of the present invention that it is adaptable for deposition on a web or other moving substrate, including deposition onto a large area substrate.

It is still a further advantage of the present invention that it can be employed in low temperature processes at atmospheric pressures, which process may be practice in an unsealed environment, open to ambient atmosphere. The method of the present invention allows control of the gas residence time $\tau$ in the relationship shown earlier in equation (3), allowing residence time $\tau$ to be reduced, with system pressure and volume controlled by a single variable, the gas flow.

As used herein, the terms "vertical," "horizontal," "top," "bottom," "front," "back," or "parallel," and the like, unless otherwise indicated, are with reference to a front/bottom horizontal face of the delivery device or a top horizontal parallel surface of the substrate being treated, in an theoretical configuration in which the delivery head is vertically over the substrate, although that configuration is optional, for example, the substrate can be positioned over the face of the delivery head or otherwise positioned.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

FIG. 2 is a cross-sectional side view of one embodiment of a delivery head showing one exemplary arrangement of gaseous materials provided to a substrate that is subject to thin film deposition;

FIGS. 3A and 3B are cross-sectional side views of one embodiment of a distribution manifold, schematically showing the accompanying deposition operation;

FIG. 5C is a plan view of a gas direction plate for the delivery head of FIG. 4;

FIG. 8A is a plan view of a nozzle plate of the gas diffuser unit of FIG. 7;

FIGS. 10A and 10B are plan and perspective views, respectively, of a separator plate used in the vertical plate embodiment of FIG. 9A;

DETAILED DESCRIPTION OF THE INVENTION

The present description is directed in particular to elements forming part of, or cooperating more directly with, apparatus in accordance with the invention. It is to be understood that elements not specifically shown or described may take various forms well known to those skilled in the art.

For the description that follows, the term "gas" or "gaseous material" is used in a broad sense to encompass any of a range of vaporized or gaseous elements, compounds, or materials. Other terms used herein, such as: "reactant," "precursor," "vacuum," and "inert gas," for example, all have their conventional meanings as would be well understood by those skilled in the materials deposition art. The figures provided are not drawn to scale but are intended to show overall function and the structural arrangement of some embodiments of the present invention. Terms "upstream" and "downstream" have their conventional meanings as relates to the direction of gas flow.

The apparatus of the present invention offers a significant departure from conventional approaches to ALD, employing an improved distribution device for delivery of gaseous materials to a substrate surface, adaptable to deposition on larger and web-based or web-supported substrates and capable of achieving a highly uniform thin-film deposition at improved throughput speeds. The apparatus and method of the present invention employs a continuous (as opposed to pulsed) gaseous material distribution. The apparatus of the present invention allows operation at atmospheric or near-atmospheric pressures as well as under vacuum and is capable of operating in an unsealed or open-air environment.

Figure 1:
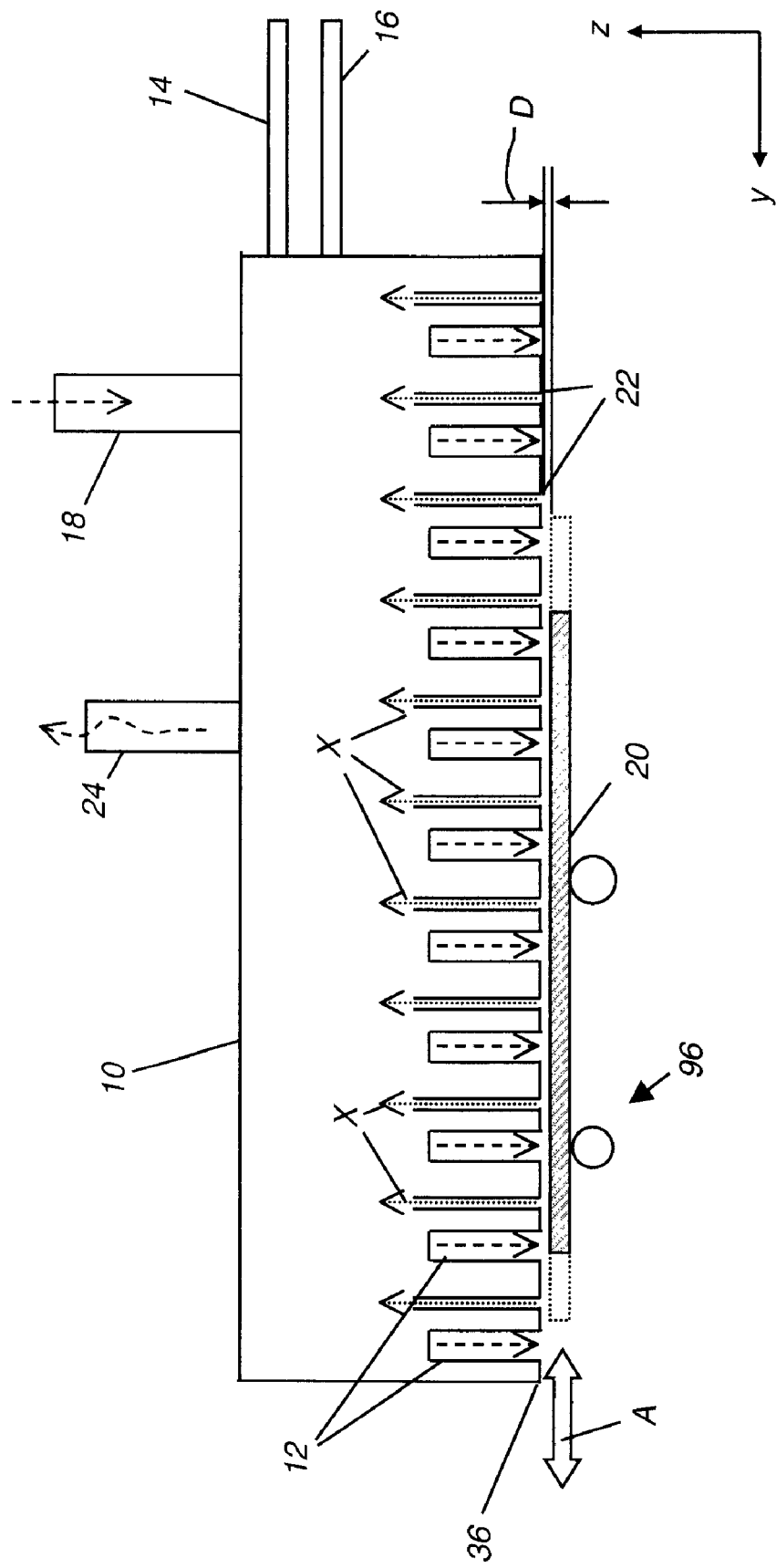
FIG. 1 is a cross-sectional side view of one embodiment of a distribution manifold for atomic layer deposition according to the present invention.

Referring to FIG. 1, there is shown a cross-sectional side view of one embodiment of a delivery head 10 for atomic layer deposition onto a substrate 20 according to the present invention. Delivery head 10 has a gas inlet conduit 14 that serves as an inlet port for accepting a first gaseous material, a gas inlet conduit 16 for an inlet port that accepts a second gaseous material, and a gas inlet conduit 18 for an inlet port that accepts a third gaseous material. These gases are emitted at an output face 36 via, output channels 12, having a structural arrangement described subsequently. The dashed-line arrows in FIG. 1 and subsequent FIGS. 2-3B refer to the delivery of gases to substrate 20 from delivery head 10. In FIG. 1, arrows X also indicate paths for gas exhaust (shown directed upwards in this figure) and exhaust channels 22, in communication with an exhaust conduit 24 that provides an exhaust port. For simplicity of description, gas exhaust is not indicated in FIGS. 2-3B. Because the exhaust gases still may contain quantities of unreacted precursors, it may be undesirable to allow an exhaust flow predominantly containing one reactive species to mix with one predominantly containing another species. As such, it is recognized that the delivery head 10 may contain several independent exhaust ports.

In one embodiment, gas inlet conduits 14 and 16 are adapted to accept first and second gases that react sequentially on the substrate surface to effect ALD deposition, and gas inlet conduit 18 receives a purge gas that is inert with respect to the first and second gases. Delivery head 10 is spaced a distance D from substrate 20, which may be provided on a substrate support, as described in more detail subsequently. Reciprocating motion can be provided between substrate 20 and delivery head 10, either by movement of substrate 20, by movement of delivery head 10, or by movement of both substrate 20 and delivery head 10. In the particular embodiment shown in FIG. 1, substrate 20 is moved by a substrate support 96 across output face 36 in reciprocating fashion, as indicated by the arrow A and by phantom outlines to the right and left of substrate 20 in FIG. 1. It should be noted that reciprocating motion is not always required for thin-film deposition using delivery head 10. Other types of relative motion between substrate 20 and delivery head 10 could also be provided, such as movement of either substrate 20 or delivery head 10 in one or more directions, as described in more detail subsequently.

The cross-sectional view of FIG. 2 shows gas flows emitted over a portion of output face 36 of delivery head 10 (with the exhaust path omitted as noted earlier). In this particular arrangement, each output channel 12 is in gaseous flow communication with one of gas inlet conduits 14, 16 or 18 seen in FIG. 1. Each output channel 12 delivers typically a first reactant gaseous material O, or a second reactant gaseous material M, or a third inert gaseous material I.

FIG. 2 shows a relatively basic or simple arrangement of gases. It is envisioned that a plurality of flows non-metal deposition precursors (like material O) or a plurality of flows metal-containing precursor materials (like material M) may be delivered sequentially at various ports in a thin-film single deposition. Alternately, a mixture of reactant gases, for example, a mixture of metal precursor materials or a mixture of metal and non-metal precursors may be applied at a single output channel when making complex thin film materials, for example, having alternate layers of metals or having lesser amounts of dopants admixed in a metal oxide material. Significantly, an inter-stream labeled I for an inert gas, also termed a purge gas, separates any reactant channels in which the gases are likely to react with each other. First and second reactant gaseous materials O and M react with each other to effect ALD deposition, but neither reactant gaseous material O nor M reacts with inert gaseous material I. The nomenclature used in FIG. 2 and following suggests some typical types of reactant gases. For example, first reactant gaseous material O could be an oxidizing gaseous material; second reactant gaseous material M would be a metal-containing compound, such as a material containing zinc. Inert gaseous material I could be nitrogen, argon, helium, or other gases commonly used as purge gases in ALD systems. Inert gaseous material I is inert with respect to first or second reactant gaseous materials O and M. Reaction between first and second reactant gaseous materials would form a metal oxide or other binary compound, such as zinc oxide ZnO or ZnS, used in semiconductors, in one embodiment. Reactions between more than two reactant gaseous materials could form a ternary compound, for example, ZnAlO.

The cross-sectional views of FIGS. 3A and 3B show, in simplified schematic form, the ALD coating operation performed as substrate 20 passes along output face 36 of delivery head 10 when delivering reactant gaseous materials O and M. In FIG. 3A, the surface of substrate 20 first receives an oxidizing material continuously emitted from output channels 12 designated as delivering first reactant gaseous material O. The surface of the substrate now contains a partially reacted form of material O, which is susceptible to reaction with material M. Then, as substrate 20 passes into the path of the metal compound of second reactant gaseous material M, the reaction with M takes place, forming a metallic oxide or some other thin film material that can be formed from two reactant gaseous materials. Unlike conventional solutions, the deposition sequence shown in FIGS. 3A and 3B is continuous during deposition for a given substrate or specified area thereof, rather than pulsed. That is, materials O and M are continuously emitted as substrate 20 passes across the surface of delivery head 10 or, conversely, as delivery head 10 passes along the surface of substrate 20.

As FIGS. 3A and 3B show, inert gaseous material I is provided in alternate output channels 12, between the flows of first and second reactant gaseous materials O and M. Notably, as was shown in FIG. 1, there are exhaust channels 22, but preferably no vacuum channels interspersed between the output channels 12. Only exhaust channels 22, providing a small amount of draw, are needed to vent spent gases emitted from delivery head 10 and used in processing.

In one embodiment, as described in more detail in copending, commonly assigned U.S. Ser. No. 11/620,744, hereby incorporated by reference in its entirety, gas pressure is provided against substrate 20, such that separation distance D is maintained, at least in part, by the force of pressure that is exerted. By maintaining some amount of gas pressure between output face 36 and the surface of substrate 20, the apparatus of the present invention provides at least some portion of an air bearing, or more properly a gas fluid bearing, for delivery head 10 itself or, alternately, for substrate 20. This arrangement helps to simplify the transport requirements for delivery head 10, as described subsequently. The effect of allowing the delivery head to approach the substrate such that it is supported by gas pressure, helps to provide isolation between the gas streams. By allowing the head to float on these streams, pressure fields are set up in the reactive and purge flow areas that cause the gases to be directed from inlet to exhaust with little or no intermixing of other gas streams. In such a device, the close proximity of the coating head to the substrate leads to relatively high pressure and high variations of pressure under the head. The absence of a gas diffuser system or an inadequate gas diffusion system within the head would indicate that there is little pressure drop for gases flowing within the head. In such a case, if random forces cause a small increase on the gap on one side of the head, the pressure in that area may be lowered and gas may flow into that area in too high a proportion. In contrast, when a diffuser system according to the present invention is used, the majority of pressure drop occurs inside the head, so that gas flow out of the head is maintained relatively uniformly despite potential variations under the delivery head.

In one such embodiment, since the separation distance D is relatively small, even a small change in distance D (for example, even 100 micrometers) would require a significant change in flow rates and consequently gas pressure providing the separation distance D. For example, in one embodiment, doubling the separation distance D, involving a change less than 1 mm, would necessitate more than doubling, preferably more than quadrupling, the flow rate of the gases providing the separation distance D. As a general principle, it is considered more advantageous in practice to minimize separation distance D and, consequently, to operate at reduced flow rates.

The present invention does not require a floating head system, however, and the delivery head and the substrate can be in at a fixed distance D as in conventional systems. For example, the delivery head and the substrate can be mechanically fixed at separation distance from each other in which the head is not vertically mobile in relationship to the substrate in response to changes in flow rates and in which the substrate is on a vertically fixed substrate support.

In one embodiment, a delivery device having an output face for providing gaseous materials for thin-film material deposition onto a substrate comprises:

(a) a plurality of inlet ports comprising at least a first inlet port, a second inlet port, and a third inlet port capable of receiving a common supply for a first gaseous material, a second gaseous material, and a third gaseous material, respectively; and (b) at least three groups of elongated emissive channels, a first group comprising one or more first elongated emissive channels, a second group comprising one or more second elongated emissive channels, and a third group comprising at least two third elongated emissive channels, each of the first, second, and third elongated emissive channels allowing gaseous fluid communication with one of corresponding first inlet port, second inlet port, and third inlet port;

wherein each first elongated emissive channel is separated on at least one elongated side thereof from the nearest second elongated emissive channel by a third elongated emissive channel;

wherein each first elongated emissive channel and each second elongated emissive channel is situated between third elongated emissive channels, wherein each of the first, second, and third elongated emissive channels extend in a length direction and are substantially in parallel;

wherein each of the elongated emissive channels in at least one group of elongated emissive channels, of the three groups of elongated emissive channels, is capable of directing a flow, respectively, of at least one of the first gaseous material, second gaseous material, and the third gaseous material substantially orthogonally with respect to the output face of the delivery device, which flow of gaseous material is capable of being provided, either directly or indirectly from each of the elongated emissive channels in the at least one group, substantially orthogonally to the surface of the substrate; and wherein at least a portion of the delivery device is formed as a plurality of apertured plates, superposed to define a network of interconnecting supply chambers and directing channels for routing each of the first, second, and third gaseous materials from its corresponding inlet port to its corresponding elongated emissive channels.

For example, the first and second gaseous materials can be mutually reactive gases, and the third gaseous material can be a purge gas.

Figure 4:
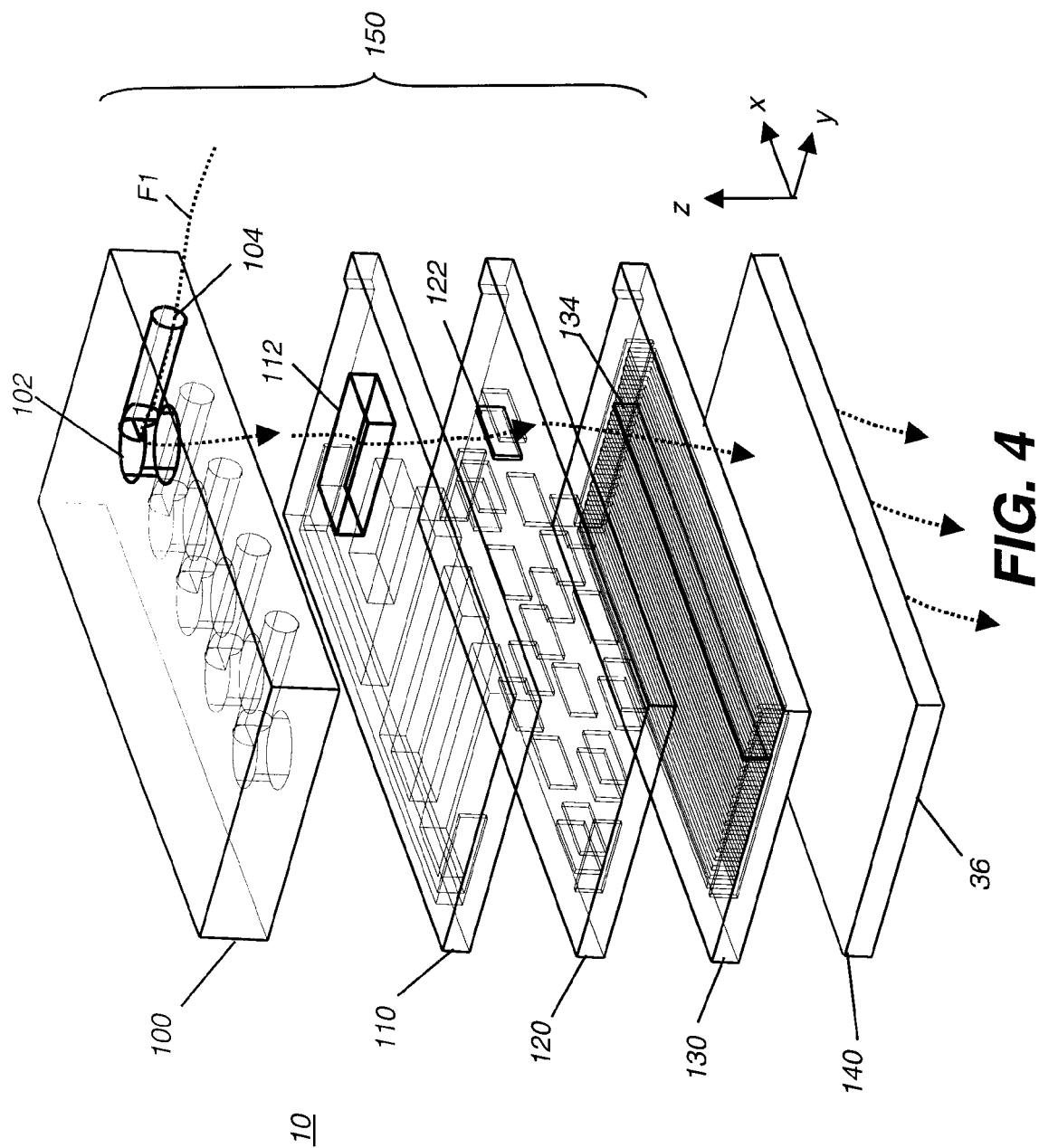
FIG. 4 is a perspective exploded view of a delivery head in a deposition system according including a diffuser unit according to one embodiment of the present invention.

The exploded view of FIG. 4 shows, for a small portion of the overall assembly in one embodiment, how delivery head 10 can be constructed from a set of apertured plates and shows an exemplary gas flow path for just one portion of one of the gases. A connection plate 100 for the delivery head 10 has a series of input ports 104 for connection to gas supplies that are upstream of delivery head 10 and not shown in FIG. 4. Each input port 104 is in communication with a directing chamber 102 that directs the received gas downstream to a gas chamber plate 110. Gas chamber plate 110 has a supply chamber 112 that is in gas flow communication with an individual directing channel 122 on a gas direction plate 120. From directing channel 122, the gas flow proceeds to a particular elongated exhaust channel 134 on a base plate 130. A gas diffuser unit 140 provides diffusion and final delivery of the input gas at its output face 36. An exemplary gas flow F1 is traced through each of the component assemblies of delivery head 10. The x-y-z axis orientation shown in FIG. 4 also applies for FIGS. 5A and 7 in the present application.

As shown in the example of FIG. 4, delivery assembly 150 of delivery head 10 is formed as an arrangement of superposed apertured plates: connection plate 100, gas chamber plate 110, gas direction plate 120, and base plate 130. These plates are disposed substantially in parallel to output face 36 in this "horizontal" embodiment. Gas diffuser unit 140 can also be formed from superposed apertured plates, as is described subsequently. It can be appreciated that any of the plates shown in FIG. 4 could itself be fabrication from a stack of superposed plates. For example, it may be advantageous to form connection plate 100 from four or five stacked apertured plates that are suitably coupled together. This type of arrangement can be less complex than machining or molding methods for forming directing chambers 102 and input ports 104.

As indicated above, the delivery device for thin-film material deposition onto a substrate comprises a gas diffuser, wherein the gaseous material from at least one (preferably all three) of a plurality of elongated channels of said first, second, and third elongated emissive channels is capable of passing through the gas diffuser prior to delivery from the delivery device to the substrate, including deposition onto the substrate, wherein the delivery device allows the passage of each gaseous material in order through the respective inlet port, elongated emissive channels, and (with respect to said at least one plurality of emissive channels) gas diffuser. The gas diffuser can be either in said at least one plurality of emissive elongated channels and/or upstream of the emissive elongated channel.

In an advantageous embodiment, the gas diffuser is capable of providing a friction factor that is greater than $1 \times 10^2$, preferably $1 \times 10^4$ to $1 \times 10^8$, more preferably $1 \times 10^5$ to $5 \times 10^6$. This provides back pressure and promotes the equalization of pressure where the flow of the at least one first, second and third gaseous material exits the delivery device.

This friction factor assumes that the characteristic area in the equation below is equal to the entire area between exhaust elongated channels on either side of each emissive elongated channel of said at least one plurality of emissive elongated channels. In other words, the area is defined by a straight line connected the two ends of the respective exhaust elongated channels. For the purpose of the apparatus claims, this also assumes a representative gas that is nitrogen at 25° C. and an average velocity of between 0.01 and 0.5 m/sec, for the purpose of calculating the friction factor for the apparatus apart from a method of use. The average velocity is calculated based on the flow rate divided by the characteristic area A defined below. (These representative values are for characterizing the delivery device apart from its method of use and do not apply to the process according to the invention, in which actual values during the process apply.)

The term "friction factor" can be explained as follows. When a flow of gas is passed through the channel, there will exist a higher pressure on the upstream side of the diffuser than exists on the downstream side due to the resistive nature of the diffuser. The difference in pressure is the known as the pressure drop across the diffuser.

A gas diffuser according to the present invention (which can be an apparatus, material, or combination thereof) provides a resistance to flow in a channel, while still allowing fluid to pass uniformly. The gas diffuser means such as used in this invention is placed at the end of a flow channel of some shape. In the absence of the gas diffuser, fluid could leave the channel at any spot and would not be constrained to leave uniformly. With the gas diffuser present, fluid traveling up to the gas diffuser will find a strong resistance there, and will travel by path of least resistance along all areas of the diffuser to exit substantially more uniformly Since the dominant property of the gas diffuser is its resistance to flow, it is convenient to characterize this resistance by accepted means in the field of fluid dynamics (Transport Phenomena, R. B. Bird, W. E. Stewart, E. N Lightfoot, John Wiley & Sons, 1960, hereby incorporated by reference). Pressure drops across a diffuser can be characterized by the friction factor, f, presented by the gas diffuser:

$$f = \frac{F_k}{A \times K} \quad (4)$$

where $F_k$ is the force exerted due to the fluid flow, ultimately related to the pressure drop, A is a characteristic area, and K represents the kinetic energy of the fluid flow. Diffusers can take many shapes. For a typical system, as described for the present invention, A is disposed perpendicular to the output flow and $F_k$ is disposed parallel to the output flow. Thus, the term $F_k/A$ can be taken as the pressure drop $\Delta P$ caused by the gas diffuser.

The kinetic energy term of the flow is:

$$K = \frac{1}{2}\rho \langle v \rangle^2 \quad (5)$$

where $\rho$ is the gas density and $\langle v \rangle$ is the average velocity, equal to the flow rate of the gaseous material divided by the characteristic area A. (The density of nitrogen can be used for a first approximation for the gases actually used in the process, or as a representative gas for characterizing the delivery head apparatus.) Thus, the pressure drop due to a gas diffuser can be reduced to:

$$\Delta P = \frac{1}{2} f \rho \langle v \rangle^2 \quad (6)$$

Equation (6) can be used to calculate the friction factor f a dimensionless number, since the other factors can be experimental determined or measured, as shown in the examples below.

Materials or devices exhibiting higher friction factors present a higher resistance to gas flow. The friction factor for a given diffuser can be measured by disposing the diffuser in some channel, and simultaneously recording the pressure drop as well as the flow rate of gas presented to the diffuser. From the flow rate of gas and knowledge of the shape of the channel, the velocity v can be calculated, thus allowing calculation of the friction factor from the above equation. The friction factor for a given system is not perfectly constant, but has some relatively weak dependence upon the flow rate. For practical purposes, it is only important that the friction factor be known at flow rates typical of use in a given system or method. With respect to a delivery head apparatus, apart from the method, the average velocity <v> can be taken as 0.01 to 0.5 m/sec as a representative number. (The claimed friction factor in the case of the apparatus should be met for all average velocities <v> in this representative range.)

A suitable gas diffuser is capable of providing a friction factor for gas flow through the gas diffuser that is greater than $1 \times 10^2$, preferably $1 \times 10^4$ to $1 \times 10^8$, more preferably $1 \times 10^5$ to $5 \times 10^6$. This provides the desired back pressure and promotes the equalization of pressure where the gas flow of the at least one first, second and third gaseous material (preferably all three gaseous materials) exits the delivery device through the gas diffuser.

As indicated above, the characteristic area A for determining the average velocity <v> for equation (6) is equal to the entire area between exhaust elongated channels on either side of each individual emissive elongated channel among the emissive elongated channels in flow communication with the gas diffuser. In other words, the area is defined by a straight line connected the two ends of the respective exhaust elongated channels. For the purpose of the apparatus claims, this also assumes a representative gas that is nitrogen at 25° C.

The skilled artisan can appreciate that typical random materials by itself will not provide the necessary friction factor. For example, a stainless steel perforated screen even though representing fairly small features for typical machined or mechanically fabricated elements, may offer a friction factor that is too low to be adequate by itself for the present gas diffuser, as shown in the Examples below.

For the purpose of determining the friction factor, in most cases, a good approximation can be made by using the pressure into the delivery head, since the effect of the flow path leading to the gas diffuser will be relatively small.

The gas diffuser can be a mechanically formed apparatus that provides the necessary friction factor, for example, wherein the emissive elongated channels are designed to provide the first, second, and third gaseous material indirectly to the substrate after passing through a gas diffuser element comprising openings in a solid material. For example, the solid material can be steel and the openings formed by molding, machining, the application of laser or lithography, or the like.

Alternatively, the gas diffuser can comprise a porous material. Instead of machining holes in a solid material, a porous material having tiny pores can be used to create the desired backpressure. The resulting uniform distribution of inlet gas allows improved uniformity of deposition growth as well as, for certain embodiments, better floatation of a floating head. Porous materials are advantageous for providing a relatively simple unit that avoids difficulty machining of steel and the like.

In the literature, porous materials have been used to create back pressure for air bearings, but such applications are not concerned about cross-flow (i.e., gas moving laterally). Thus, sintered alumina particles might be used to form a membrane for an air bearing. In the preferred embodiment of the ALD system of the present invention, however, gases preferably flow substantially vertically from the outlet, with minimal or no inadvertent sideways motion that could allow gas mixing. Therefore porous materials with substantially vertical tubular openings or pores to direct the gas flow are especially desirable and advantageous.

Porous materials have also been for filters, where the object is to keep one component of a flow on one side, while allowing another component to pass through. In contrast, in the present invention, moderate resistance to the flow of the entire gaseous material is the objective. For this purpose, two preferred classes of porous materials are as follows:

A first preferred class of porous materials comprises porous materials with uniform, controlled diameter, columnar-type pore structure. In a membrane (or layer) made of such material, flow through the membrane is substantially uni-directional, essentially without any cross-flow between pore channels. Alumina formed by anodization of highly pure aluminum is well-known in the literature for its uniformity of pore diameter (though the cross-sectional shape of the pores is not necessarily round or regular), and such materials are commercially available at diameters of 0.02, 0.1, and 0.2 microns. The pores in ANOPORE alumina, a commercially available alumina, are fairly dense, $1.23 \times 10^9$ pores/cm$^2$ (J Chem Phys, V. 96, p. 7789, 1992). However, a wide variety of pore diameters and interpore distance can be fabricated. Porous materials can also be formed of titanium oxides, zirconium oxides, and tin oxides (Adv. Materials, V. 13, p. 180, 2001). Another commercially available material with columnar pores is a Polycarbonate Track Etch (PCTE) membrane, made from a thin, microporous polycarbonate film material, known as NUCLEOPORE. Block copolymers can form similar configurations, with a wide range of tunability.

Thus, in a preferred embodiment, the gas diffuser comprises porous material comprises an isolating, non-connecting pores structure in which pores are substantially vertical to the surface, for example, anodic alumina.

In all these materials, the precise range of pore diameter and density of pores (or pore volume) must be adjusted to achieve the appropriate friction factor for the flow required. It is desirable to avoid reactivity of the diffusing membrane with the flowing gases. This is likely to be less of a potential issue, for example, for inorganic oxides than for organic-based materials.

Furthermore, the membrane must have some mechanical toughness. The flowing gases will exert pressure on the membranes. The toughness could be achieved by a support membrane, so that the friction factor is generated by a layer with smaller pores coupled with a more robust layer with larger pores.

In a second preferred class of porous materials, porous materials are fabricated such that the flow can be isotropic, i.e. moving sideways inside the membrane, as well as through the membrane. However, for present purposes, such an isotropically-flowing material is preferably separated by walls on non-porous material (for example, ribs) that isolate gaseous material in each output channel from gaseous material in other output channels and prevent gaseous materials from intermingling in the gas diffuser or when leaving the gas diffuser or delivery head. For example, such porous materials can be sintered from small particles, either organic or inorganic. Sintering typically involves applying heat and/or pressure, preferably both, sufficient to bond the particles. A wide variety of such porous materials are available commercially, such as porous glass (VYCOR has, for example, having a void volume of 28%) and porous ceramics. Alternatively, fibrous materials can be compressed to create a tight network to limit or resist the flow of gas. Alternatively, porous stainless steel can be formed by plasma coating onto a subsequently removed substrate.

In one embodiment, for producing suitable backpressure while still providing relative isolation between gas channels, polymeric materials treated in a way to generate useful pores can be employed, for example, TEFLON material that is treated to produce porosity (GoreTex, Inc.; Newark, Del.). In this case, the pores may not be interconnected. Also, the natural chemical inertness of such materials is advantageous.

For porous materials that comprise pores formed from the interstitial space between particles, pores that are interconnected voids in a solid material formed by a voiding agent or other means, or pores that are formed from micro-scale or nano-scale fibers. For example, the porous material can be formed from the interstitial space between inorganic or organic particles which is held together by sintering, either by pressure and/or heat, adhesive material, or other bonding means. Alternatively, the porous material can result from the processing of a polymer film to generate porosity.

In a preferred embodiment, the gas diffuser comprises a porous material that comprise pores that are less than 10,000 nm in average diameter, preferably 10 to 5000 nm, more preferably 50 to 5000 nm in average diameter, as determined by mercury intrusion porosity measurement.

Various configurations of the porous material in the gas diffuser are possible. For example, the porous material can comprises one or more layers of different porous materials or a layer of porous material supported by a porous or perforated sheet, which layers are optionally separated by spacer elements. Preferably, the porous material comprises a layer that is 5 to 1000 micrometers thick, preferably 5 to 100 micrometers thick, for example, about 60 µm. In one embodiment, the porous material is in the form of at least one horizontally disposed layer that covers the face of the delivery assembly and comprises the part of the delivery device from which the gaseous materials exits the output face.

The porous material can form a continuous layer, optionally with passages mechanically formed therein. For example, the porous layer of the gas diffuser can comprise mechanically formed openings or elongated channels for the relatively unimpeded flow of exhaust gaseous material back through the delivery device. Alternatively, the layer of porous material can be in the form of a substantially completely continuous plate in a stack of plates.

In still another embodiment, the porous material can be introduced or formed inside elongated emissive channels or other walled channels in the flow path from the elongated emissive channels, for example by the bonding or sintering of particles introduced into the channels. Channels can be at least partially filled by porous material. For example, a diffuser element or portion thereof can be formed from elongated channels in a steel plate in which particles are introduced and then sintered.

Thus, the gas diffuser can be an assembly of elements in which porous material is held in separate confined areas. For example, porous alumina material can be grown onto a previously machined piece of aluminum so that the resulting porous structure has big openings for purge channels and sheets of vertical pores for the supply gases.

Figure 5A:
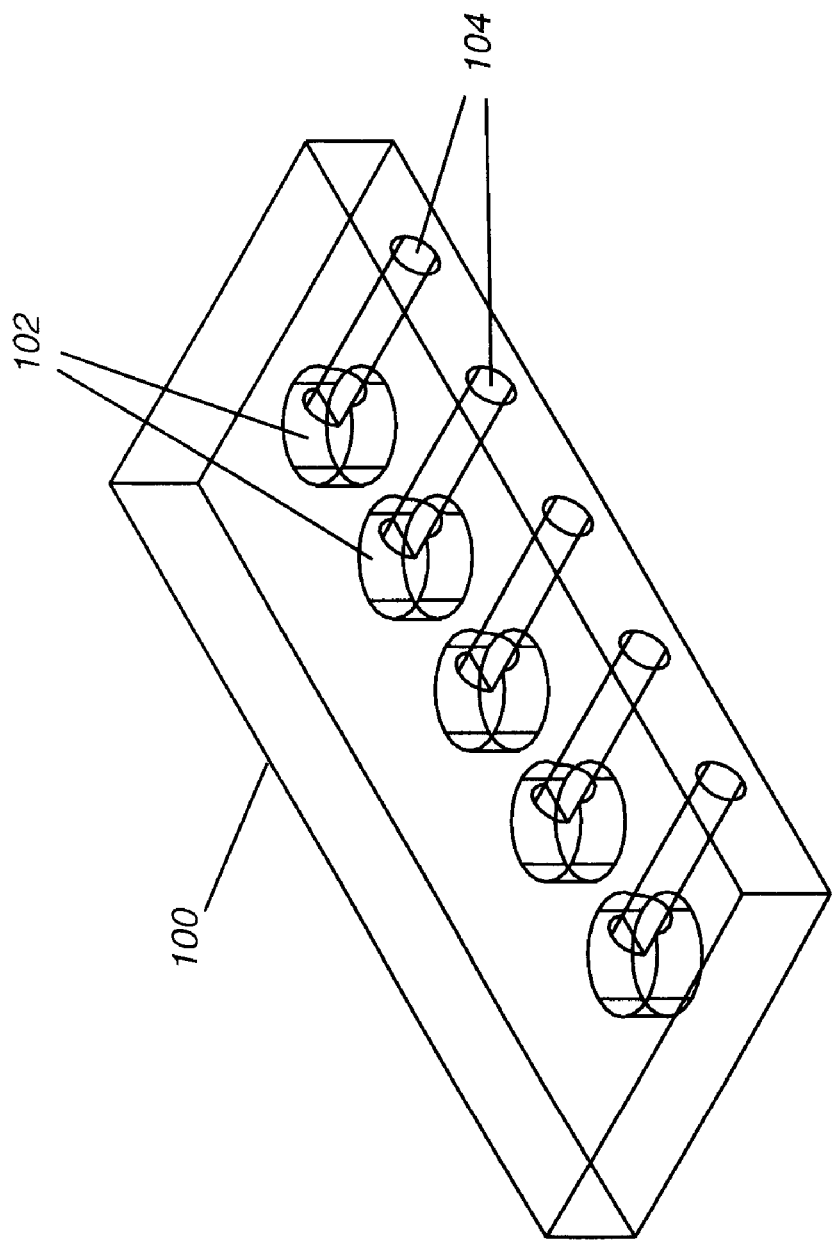
FIG. 5A is a perspective view of a connection plate for the delivery head of FIG. 4.
Figure 5B:
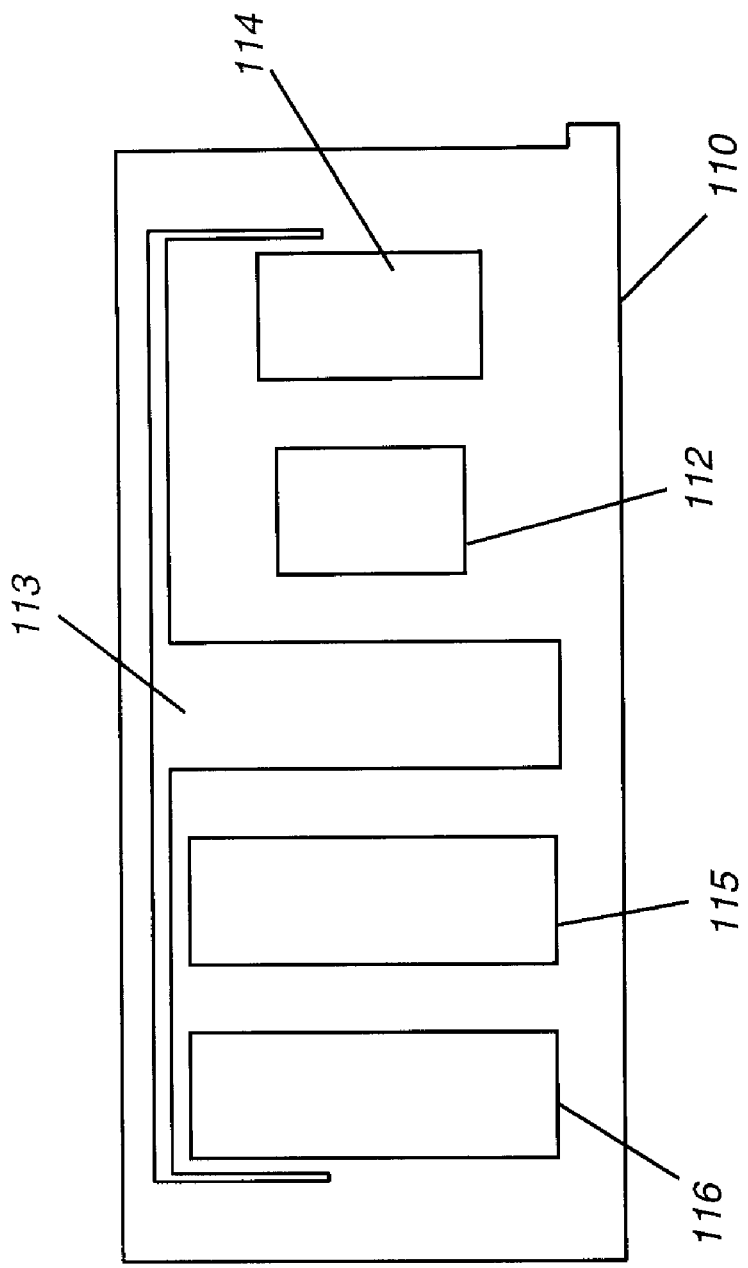
FIG. 5B is a plan view of a gas chamber plate for the delivery head of FIG. 4.

FIGS. 5A through 5D show each of the major components that are combined together to form delivery head 10 in the embodiment of FIG. 4. FIG. 5A is a perspective view of connection plate 100, showing multiple directing chambers 102. FIG. 5B is a plan view of gas chamber plate 110. A supply chamber 113 is used for purge or inert gas for delivery head 10 in one embodiment. A supply chamber 115 provides mixing for a precursor gas (O) in one embodiment; an exhaust chamber 116 provides an exhaust path for this reactive gas. Similarly, a supply chamber 112 provides the other needed reactive gas, second reactant gaseous material (M); an exhaust chamber 114 provides an exhaust path for this gas.

FIG. 5C is a plan view of gas direction plate 120 for delivery head 10 in this embodiment. Multiple directing channels 122, providing a second reactant gaseous material (M), are arranged in a pattern for connecting the appropriate supply chamber 112 with base plate 130. Corresponding exhaust directing channels 123 are positioned near directing channels 122. Directing channels 90 provide the first reactant gaseous material (O) and have corresponding exhaust directing channels 91. Directing channels 92 provide third inert gaseous material (I). Again, it must be emphasized that FIGS. 4 and 5A-5D show one illustrative embodiment; numerous other embodiments are also possible.

Figure 5D:
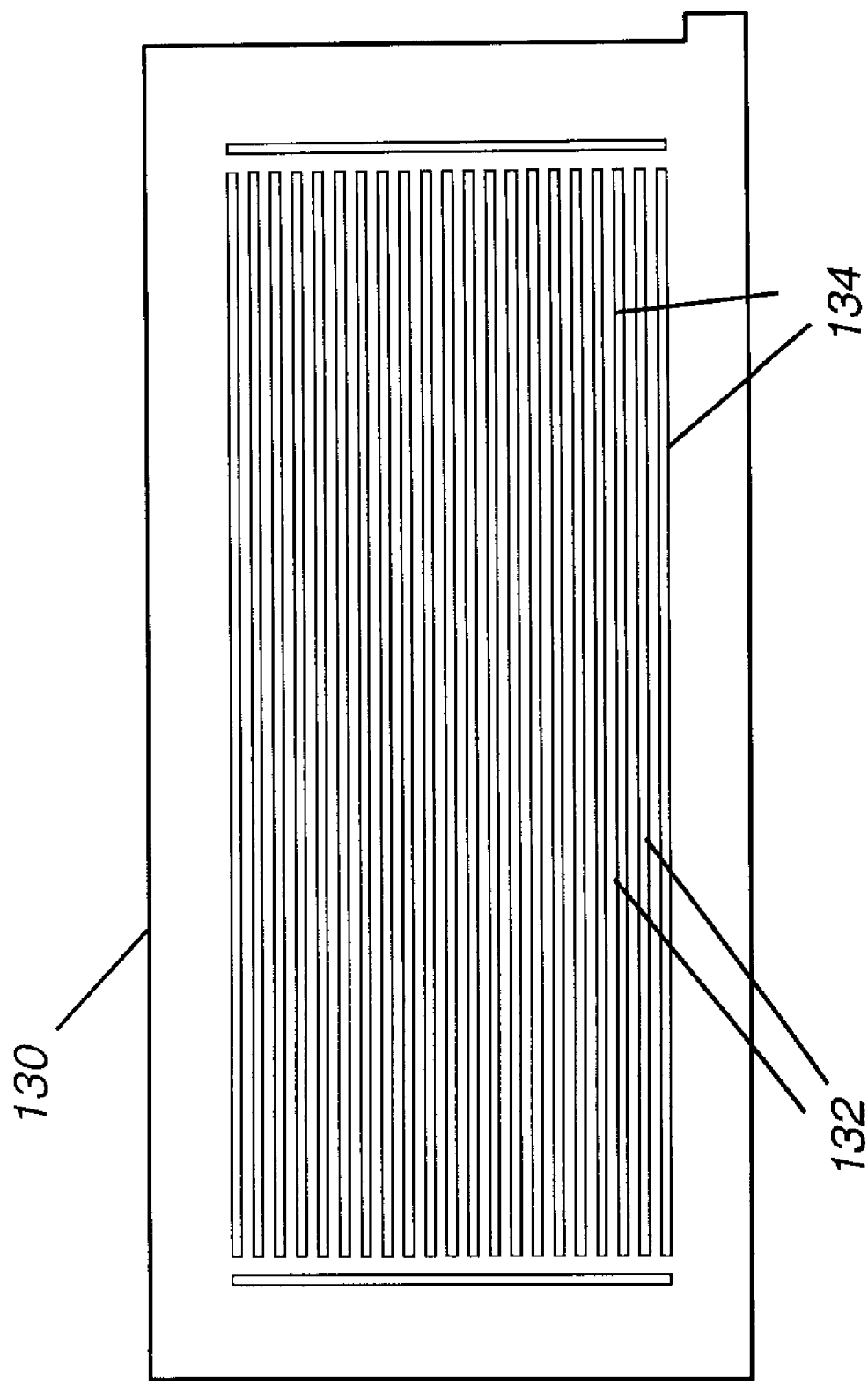
FIG. 5D is a plan view of a base plate for the delivery head of FIG. 4.

FIG. 5D is a plan view of base plate 130 for delivery head 10. Base plate 130 has multiple elongated emissive channels 132 interleaved with elongated exhaust channels 134. Thus, in this embodiment, there are at least two elongated second emissive channels and each first elongated emissive channel is separated on both elongated sides thereof from the nearest second elongated emissive channel by firstly an elongated exhaust channel and secondly a third elongated emissive channel. More particularly there are a plurality of second elongated emissive channels and a plurality of first elongated emissive channels; wherein each first elongated emissive channel is separated on both elongated sides thereof from the nearest second elongated emissive channel by firstly an elongated exhaust channel and secondly a third elongated emissive channel; and wherein each second elongated emissive channel is separated on both elongated sides thereof from the nearest first elongated emissive channel by firstly an elongated exhaust channel and secondly third elongated emissive channel. Obviously, the delivery device can nevertheless comprise a first or second elongated emissive channel at each of two ends of the delivery head that does not have a second or first elongated emissive channel, respectively, on the side closest to an edge (the upper and lower edge in FIG. 5D) of the output face of the delivery device.

Figure 6:
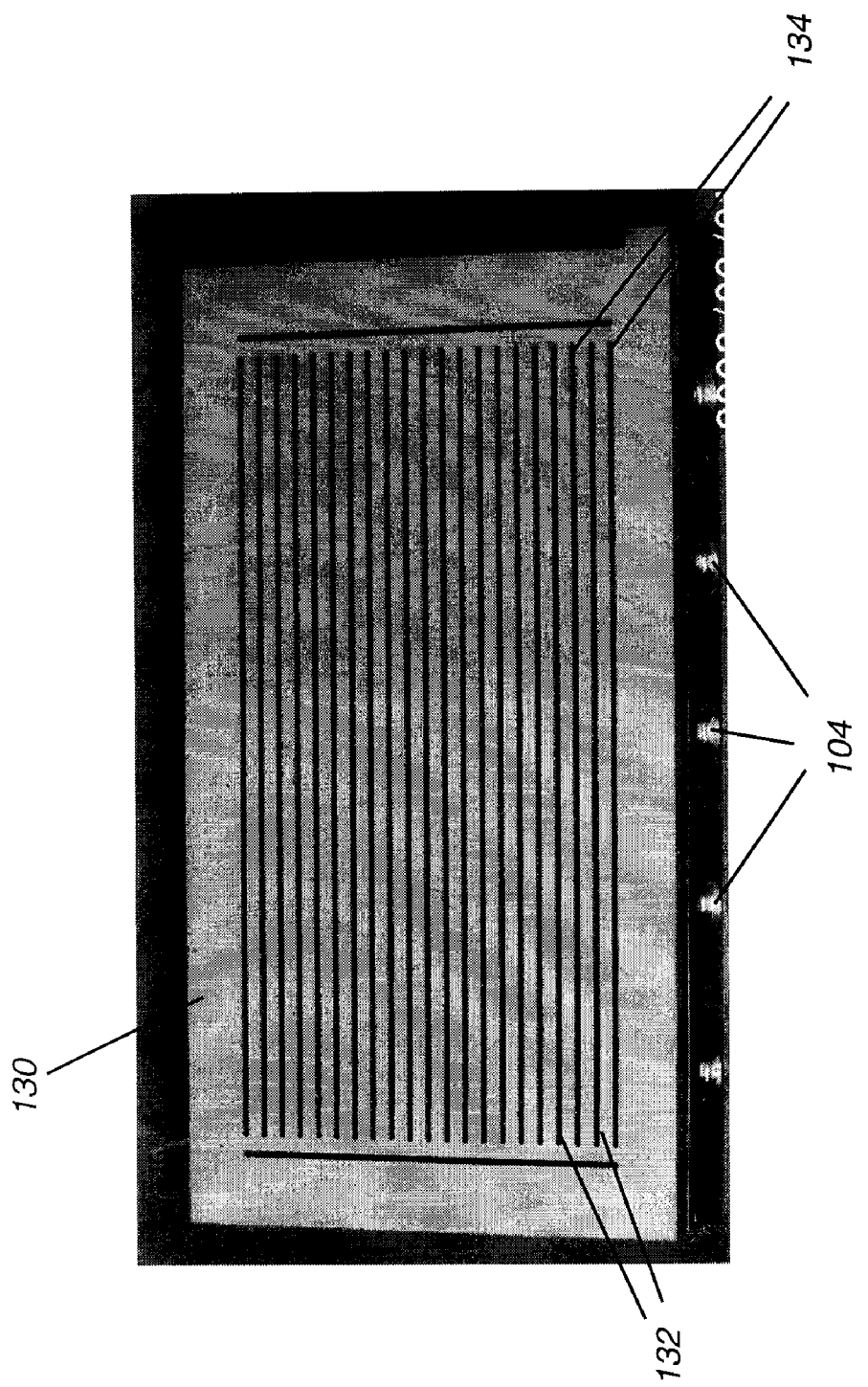
FIG. 6 is a perspective view showing a base plate on a delivery head in one embodiment.

FIG. 6 is a perspective view showing base plate 130 formed from horizontal plates and showing input ports 104. The perspective view of FIG. 6 shows the external surface of base plate 130 as viewed from the output side and having elongated emissive channels 132 and elongated exhaust channels 134. With reference to FIG. 4, the view of FIG. 6 is taken from the side that faces the direction of the substrate.

Figure 7:
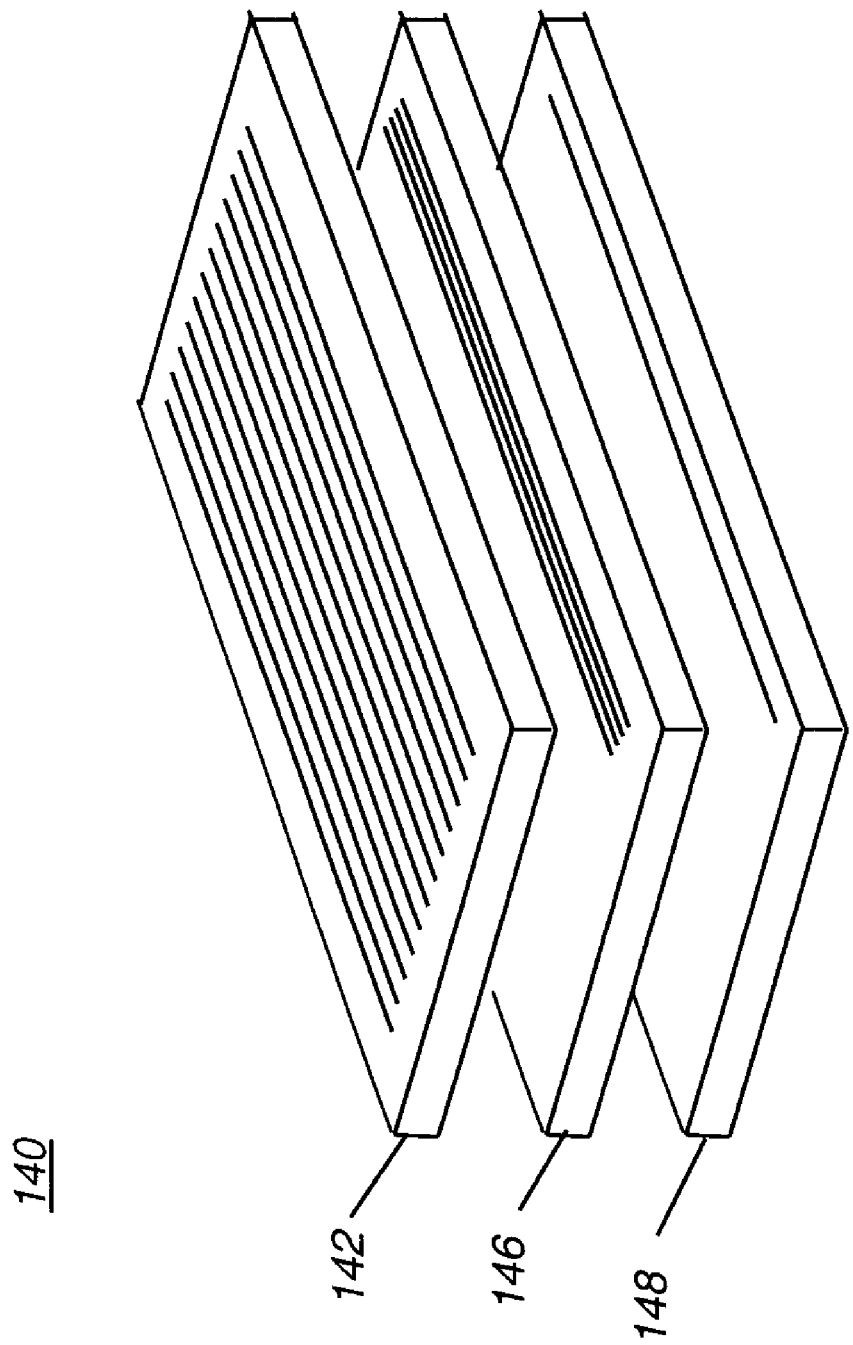
FIG. 7 is an exploded view of a gas diffuser unit according to one embodiment.

The exploded view of FIG. 7 shows the basic arrangement of components used to form one embodiment of a mechanical gas diffuser unit 140, as used in the embodiment of FIG. 4 and in other embodiments as described subsequently. These include a nozzle plate 142, shown in the plan view of FIG. 8A. As shown in the plan view of FIG. 8A, nozzle plate 142 mounts against base plate 130 and obtains its gas flows from elongated emissive channels 132. In the embodiment shown, first diffuser output passage 143 in the form of nozzle holes provide the needed gaseous materials. Slots 180 are provided in the exhaust path, as described subsequently.

Figure 8B:
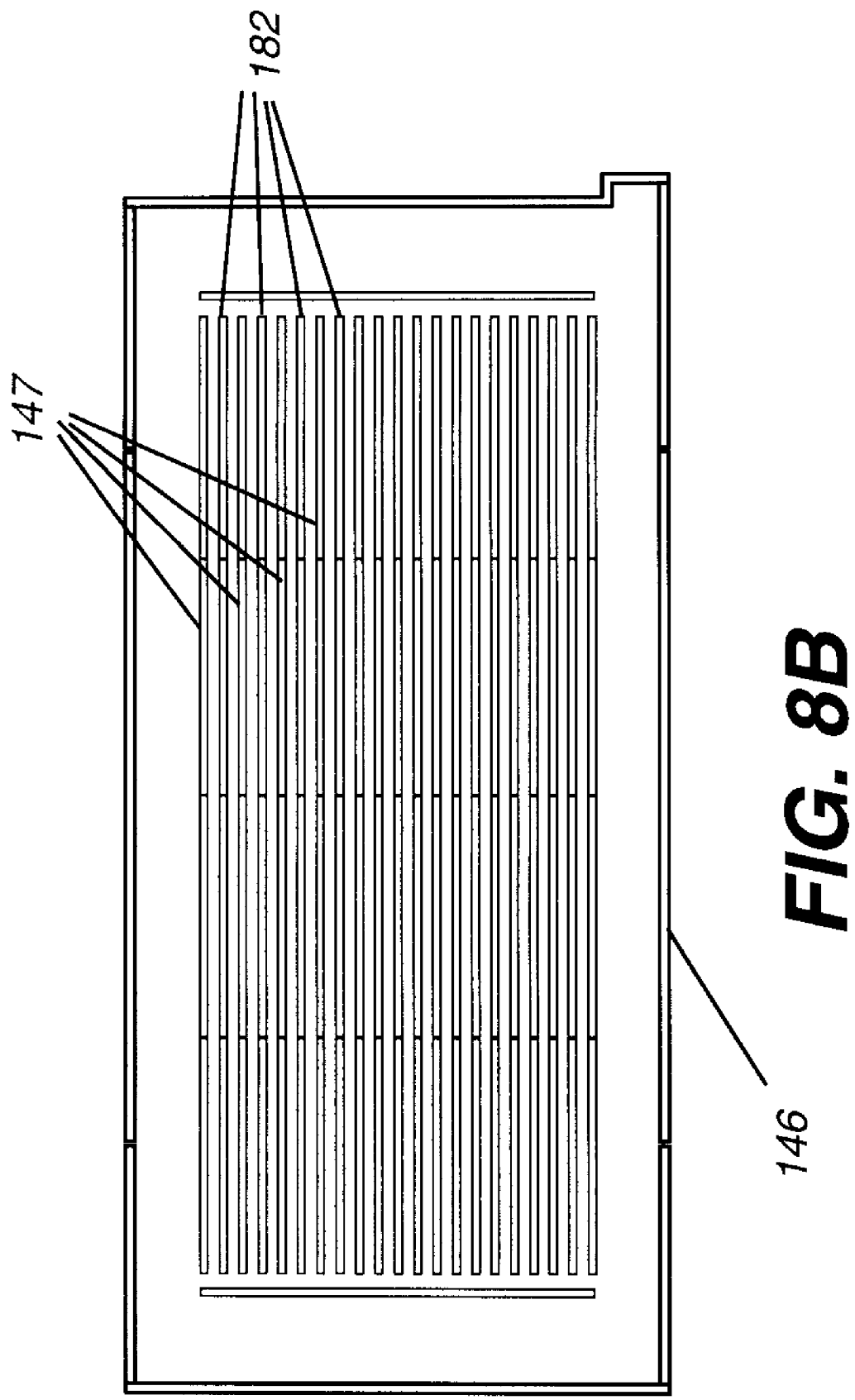
FIG. 8B is a plan view of a gas diffuser plate of the gas diffuser unit of FIG. 7.

A gas diffuser plate 146, which diffuses in cooperation with nozzle plate 142 and face plate 148, shown in FIG. 8B, is mounted against nozzle plate 142. The arrangement of the various passages on nozzle plate 142, gas diffuser plate 146, and face plate 148 are optimized to provide the needed amount of diffusion for the gas flow and, at the same time, to efficiently direct exhaust gases away from the surface area of substrate 20. Slots 182 provide exhaust ports. In the embodiment shown, gas supply slots forming second diffuser output passage 147 and exhaust slots 182 alternate in gas diffuser plate 146.

Figure 8C:
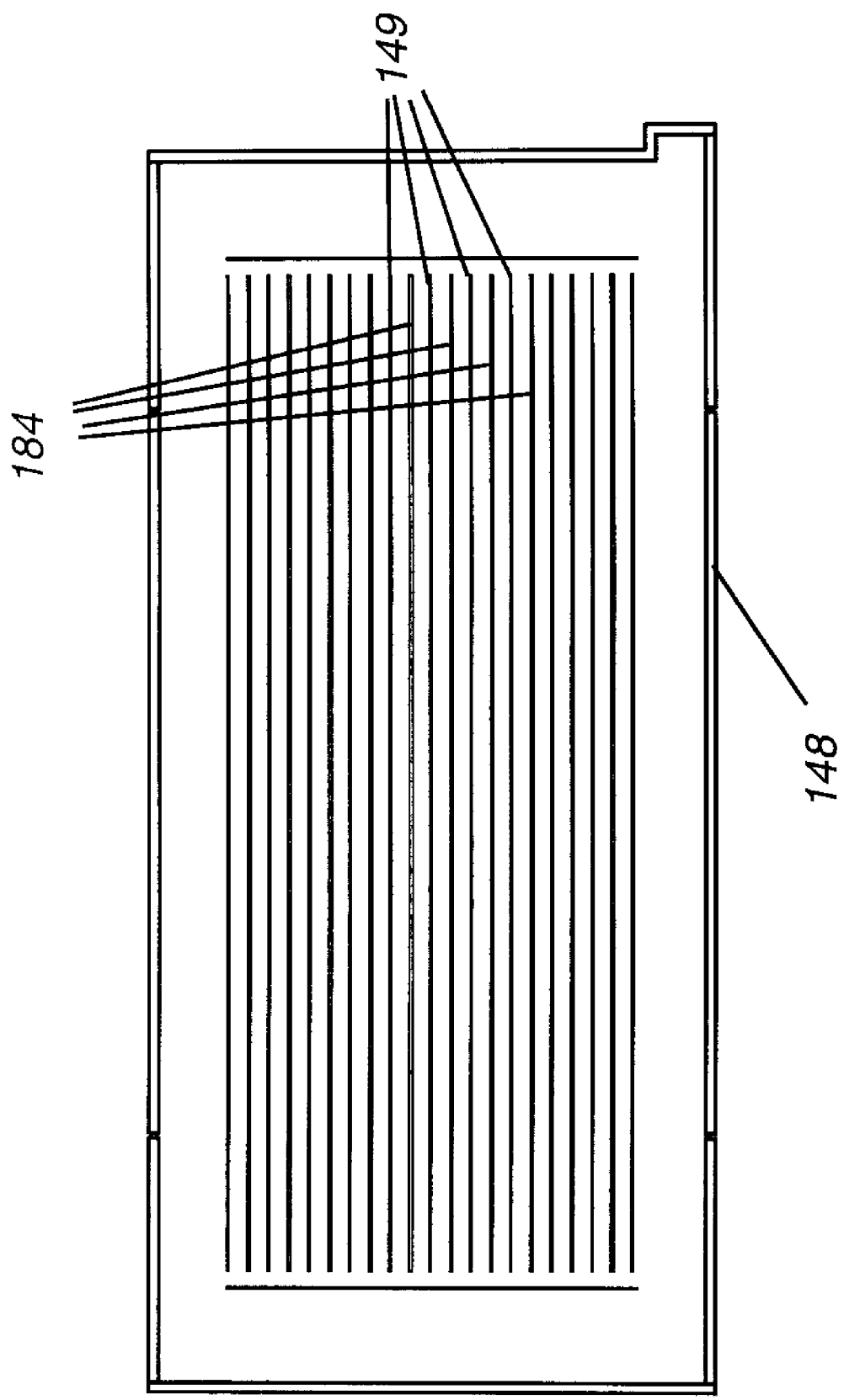
FIG. 8C is a plan view of a face plate of the gas diffuser unit of FIG. 7.

A face plate 148, as shown in FIG. 8C, then faces substrate 20. Third diffuser passage 149 for providing gases and exhaust slots 184 again alternate with this embodiment.

Figure 8D:
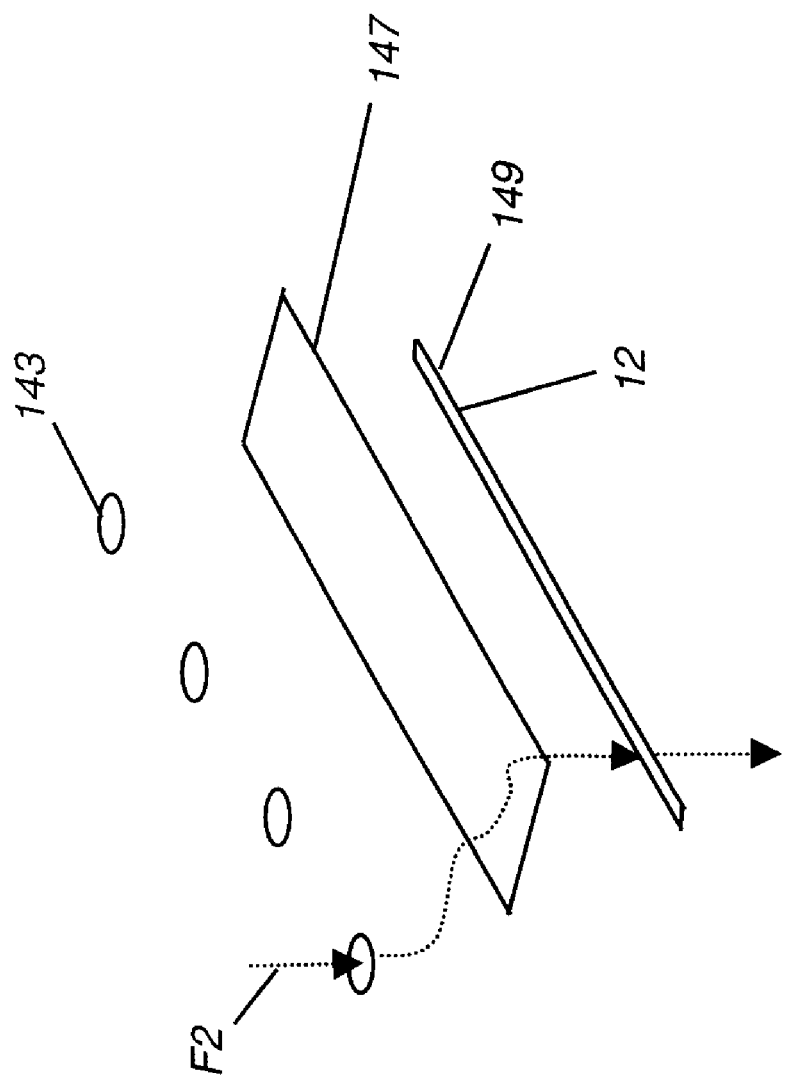
FIG. 8D is a perspective view of gas mixing within the gas diffuser unit of FIG. 7.
Figure 8E:
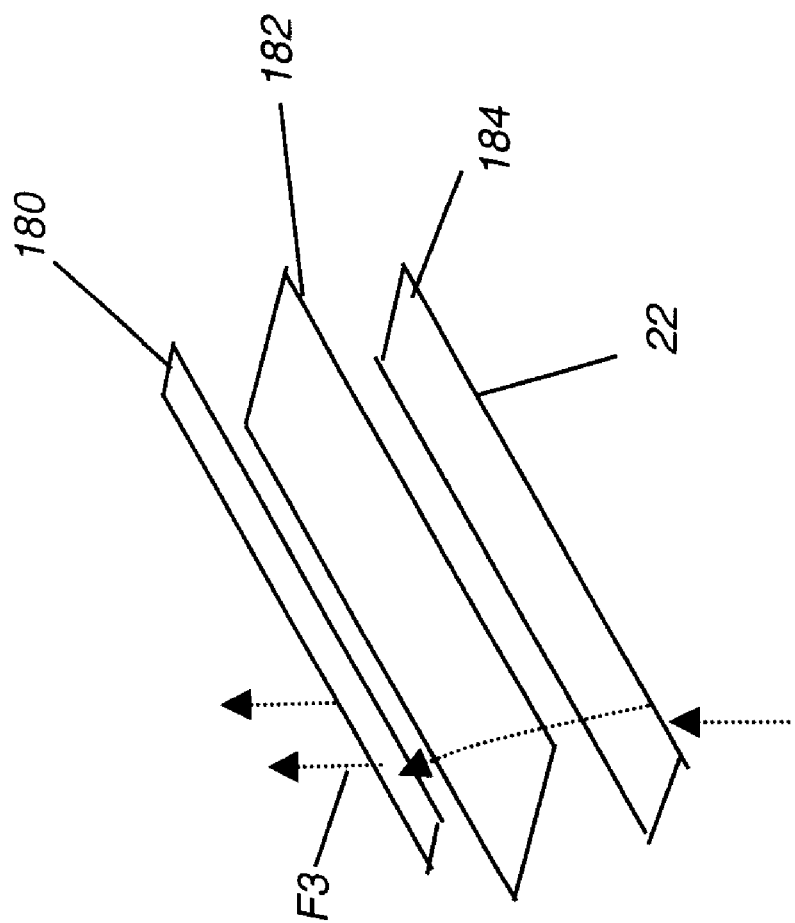
FIG. 8E is a perspective view of the gas ventilation path using the gas diffuser unit of FIG. 7.

FIG. 8D focuses on the gas delivery path through gas diffuser unit 140; FIG. 8E then shows the gas exhaust path in a corresponding manner. Referring to FIG. 8D there is shown, for a representative set of gas ports, the overall arrangement used for thorough diffusion of the reactant gas for an output flow F2 in one embodiment. The gas from base plate 130 (FIG. 4) is provided through first diffuser passage 143 on nozzle plate 142. The gas goes downstream to second diffuser passage 147 on gas diffuser plate 146. As shown in FIG. 8D, there can be a vertical offset (that is, using the horizontal plate arrangement shown in FIG. 7, vertical being normal with respect to the plane of the horizontal plates) between passages 143 and 147 in one embodiment, helping to generate backpressure and thus facilitate a more uniform flow. The gas then goes further downstream to third diffuser passage 149 on face plate 148 to provide output channel 12. The different diffuser passages 143, 147 and 149 may not only be spatially offset, but may also have different geometries to contribute to intermolecular mixing and homogenous diffusion of the gaseous materials when flowing through the delivery head.

In the particular case of the arrangement of FIG. 8D, the majority of the backpressure is generated by the nozzle holes forming passage 143. If this gas is directed without the subsequent passages 147 and 149 to the substrate, the high velocity of the gas coming out of the nozzle holes may cause non-uniformities. Thus passages 147 and 149 help to improve uniformity of the gas flow. Alternatively, a coating device can operate with only a nozzle based back-pressure generator, thus eliminating passages 147 and 149, at the expense of slight coating non-uniformities.

The nozzle holes in the nozzle plate 142 can be of any size suitable for back-pressure generation. These holes are preferably less than 200 microns, more preferably less than 100 microns in diameter on average. Furthermore, the use of holes in the back-pressure generator is convenient but not necessary. The back pressure can also be generated by other geometries such as a slit, as long as the size is chosen to provide the desired back pressure.

FIG. 8E symbolically traces the exhaust path provided for venting gases in a similar embodiment, where the downstream direction is opposite that for supplied gases. A flow F3 indicates the path of vented gases through sequential third, second, and first exhaust slots 184, 182, and 180, respectively. Unlike the more circuitous mixing path of flow F2 for gas supply, the venting arrangement shown in FIG. 8E is intended for the rapid movement of spent gases from the surface. Thus, flow F3 is relatively direct, venting gases away from the substrate surface.

Thus, in the embodiment of FIG. 7, the gaseous material from each of the individual elongated emissive channels among the first, second, and third elongated emissive channels 132 is capable of separately passing through the gas diffuser unit 140 prior to delivery from the delivery device to the substrate, wherein the delivery device allows the passage of each gaseous material, in order, through the respective inlet port, elongated emissive channels, and gas diffuser unit 140.

The gas diffuser unit in this embodiment is gas diffuser means for each of the three gaseous materials, although separate or isolated diffuser elements can be used that do not form a common assembly. Diffuser elements can also be associated with, or placed in, the exhaust channels.

In this embodiment, also, the gas diffuser unit 140 is a unit is designed to be separable from the rest of the delivery head, the delivery assembly 150, and substantially covers the final openings or flow passages for the first, second, and third gaseous material in the delivery device prior to the gas diffuser element. Thus, the gas diffuser unit 140 provides essentially the final flow path for the first, second and third gaseous material prior to delivery from the output face of the delivery device to the substrate. However, the gas diffuser element can also be designed as an inseparable part of delivery head.

In particular, the gas diffuser unit 140 in the embodiment of FIG. 7 comprises interconnected vertically overlying passages in three vertically arranged gas diffuser components (or plates), in combination providing a flow path for gaseous materials. The gas diffuser unit 140 provides two substantially vertical flow paths separated by a substantially horizontal flow path, wherein each substantially vertical flow path is provided by one or more passages extending in an elongated direction in at two elements, and wherein each substantially horizontal flow path is in a thin space between parallel surface areas of two parallel gas diffuser components. In this embodiment, the three substantially horizontally extending diffuser components are substantially flat stacked plates, and a relatively thin space is defined by the thickness of a central gas diffuser component (the gas diffuser plate 146) situated between adjacent parallel gas diffuser components, the nozzle plate 142 and the face plate 148. However, two of the plates in FIG. 7 can be replaced by a single plate, in which gas diffuser plate 146 and face plate 148 are, for example, machined or otherwise formed into a single plate. In that case, a single element or plate of the gas diffuser can have a plurality of passages each of which, in perpendicular cross-section of the plate thickness taken parallel to an associated elongated emissive channel, forms an elongated passage parallel to the surface of the plate open at one surface of the plate, which elongated passage is integrally connected near one end thereof to a narrow vertical passage leading to the other surface of the plate. In other words, a single element could combine second and third diffuser passages 147 and 149 of FIG. 8D into a single element or plate.

Thus, a gas diffuser unit in accordance with the present invention can be a multilevel system comprising a series of at least two substantially horizontally extending diffuser components with parallel surfaces facing each other in an orthogonal direction with respect to the face of the delivery device (for example, stacked plates). In general, in association with each elongated emissive channel of the first, second, and third emissive channels, the gas diffuser comprises vertically overlying or superposed passages, respectively, in the at least two vertically arranged gas-diffuser plates, in combination providing a flow path for gaseous material that comprises two substantially vertical flow paths separated by a substantially horizontal flow path, wherein each substantially vertical flow path is provided by one or more passages, or passage components, extending in an elongated direction and wherein each substantially horizontal flow path is provided by a thin space between parallel surface areas in parallel plates, wherein vertical refers to the orthogonal direction with respect to the output face of the delivery device. The term component passages refers to a component of a passage in an element that does not pass all the way through the element, for example, the two component passages formed by combining second and third diffuser passages 147 and 149 of FIG. 8D into a single element or plate In the particular embodiment of FIG. 7, the gas diffuser comprises three vertically overlying sets of passages, respectively, in three vertically arranged gas-diffuser plates, wherein a relatively thin space is defined by the thickness of a central gas diffuser plate situated between two parallel gas diffuser plates. Two of the three diffuser components, a sequentially first and third diffuser component, each comprises passages extending in an elongated direction for the passage of gaseous material, wherein passages in the first diffuser component is horizontally offset (in a direction perpendicular to the length of the elongated direction) with respect to corresponding (interconnected) passages in the third diffuser component. This offset (between the passages 143 and passages 149) can be better seen in FIG. 8D.

Furthermore, a sequentially second gas diffuser component positioned between the first and third diffuser component comprises passages 147 each in the form of an elongated center opening that is relatively broader than the width of the passages in each of the first and third second diffuser component, such that center opening is defined by two elongated sides and contains the interconnected passages of the first diffuser component and the third diffuser component, respectively, within its borders when viewed from above the gas diffuser looking down. Consequently, the gas diffuser unit 140 is capable of substantially deflecting the flow of the gaseous material passing therethrough. Preferably, the deflection is at an angle of 45 to 135 degrees, preferably about 90 degrees, such that orthogonal gas flow is changed to parallel gas flow with respect to the surface of the output face and/or substrate. Thus, the flow of the gaseous material can be substantially vertical through the passages in the first and third gas diffuser components and substantially horizontal in the second gas diffuser component.

In the embodiment of FIG. 7, each of a plurality of passages in the first gas diffuser component comprises a series of holes or perforations extending along an elongated line, wherein the corresponding interconnected passages in the third diffuser component is an elongated rectangular slot, which is optionally not squared at the ends. (Thus, more than one passage in the first gas diffuser component can connect with a single passage in a subsequent gas diffuser component.)

Alternatively, as indicated above, a gas diffuser can comprise a porous material, wherein the delivery device is designed such that each of the individual emissive elongated channels provide gaseous material indirectly to the substrate after passing through the porous material either within each individual emissive elongated channel and/or upstream of each of the emissive elongated channel. Porous materials typically comprise pores that are formed by a chemical transformation or present in a naturally occurring porous material.

Referring back to FIG. 4, the combination of components shown as connection plate 100, gas chamber plate 110, gas direction plate 120, and base plate 130 can be grouped to provide a delivery assembly 150. Alternate embodiments are possible for delivery assembly 150, including one formed from vertical, rather than horizontal, apertured plates, using the coordinate arrangement and view of FIG. 4.

Apertured plates used for delivery head 10 could be formed and coupled together in a number of ways. Advantageously, apertured plates can be separately fabricated, using known methods such as progressive die, molding, machining, or stamping. Combinations of apertured plates can vary widely from those shown in the embodiments of FIGS. 4 and 9A-9B, forming delivery head 10 with any number of plates, such as from 5 to 100 plates. Stainless steel is used in one embodiment and is advantageous for its resistance to chemicals and corrosion. Generally, apertured plates are metallic, although ceramic, glass, or other durable materials may also be suitable for forming some or all of the apertured plates, depending on the application and on the reactant gaseous materials that are used in the deposition process.

For assembly, apertured plates can be glued or coupled together using mechanical fasteners, such as bolts, clamps, or screws. For sealing, apertured plates can be skin-coated with suitable adhesive or sealant materials, such as vacuum grease. Epoxy, such as a high-temperature epoxy, can be used as an adhesive. Adhesive properties of melted polymer materials such as polytetrafluoroethylene (PTFE) or TEFLON have also been used to bond together superposed apertured plates for delivery head 10. In one embodiment, a coating of PTFE is formed on each of the apertured plates used in delivery head 10. The plates are stacked (superposed) and compressed together while heat is applied near the melting point of the PTFE material (nominally 327 degrees C.). The combination of heat and pressure then forms delivery head 10 from the coated apertured plates. The coating material acts both as an adhesive and as a sealant. Kapton and other polymer materials could alternately be used as interstitial coating materials for adhesion.

Figure 9A:
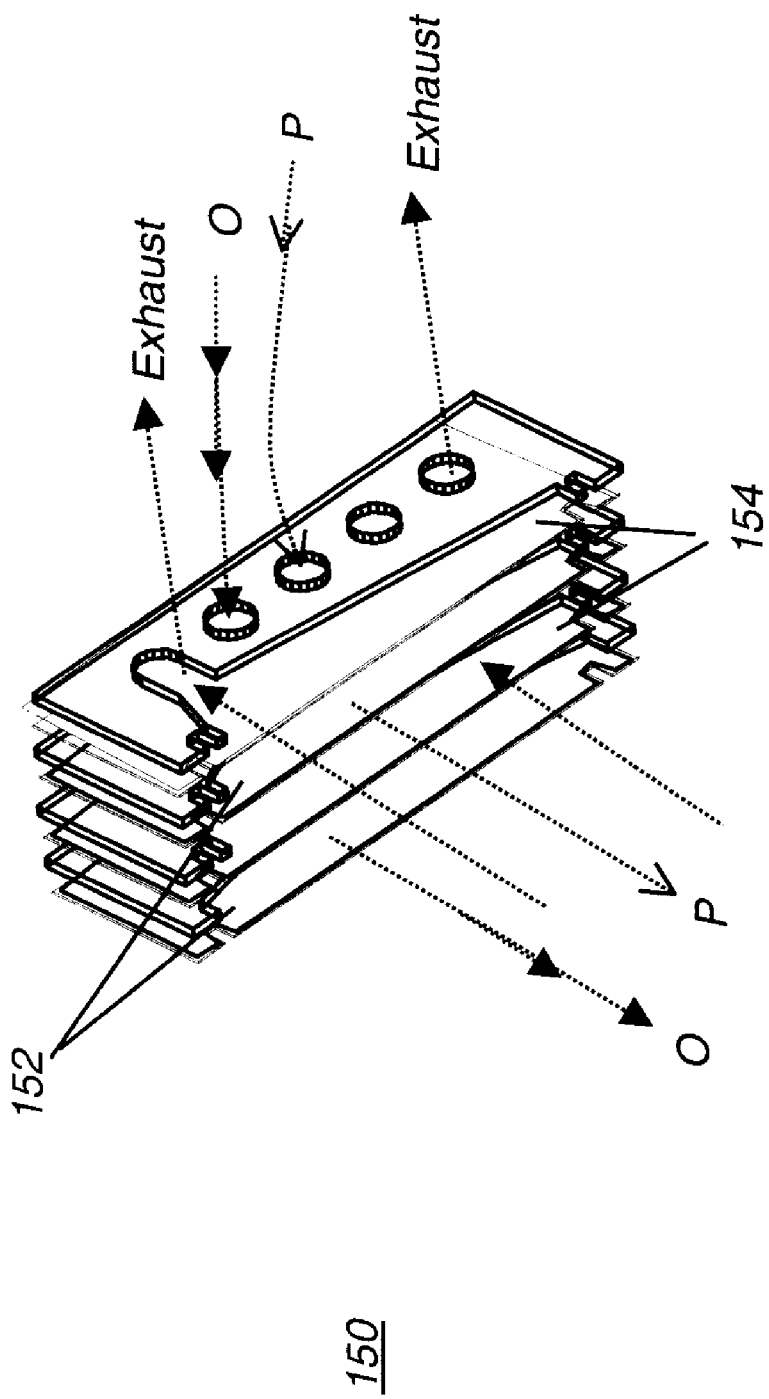
FIG. 9A is a perspective view of a portion of the delivery head in an embodiment using vertically stacked plates.
Figure 9B:
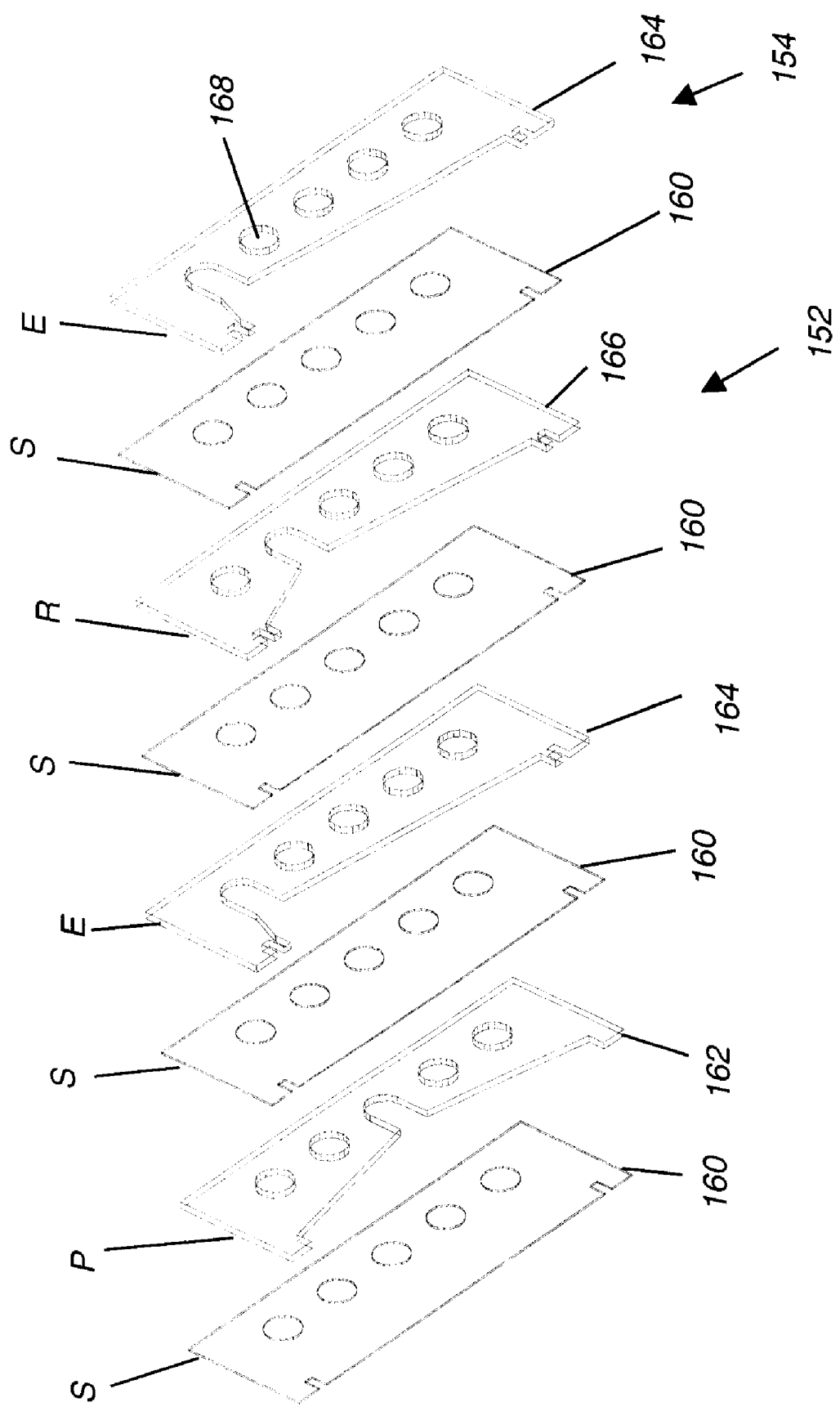
FIG. 9B is an exploded view of the components of the delivery head shown in FIG. 9A.

As shown in FIGS. 4 and 9B, apertured plates must be assembled together in the proper sequence for forming the network of interconnecting supply chambers and directing channels that route gaseous materials to output face 36. When assembled together, a fixture providing an arrangement of alignment pins or similar features could be used, where the arrangement of orifices and slots in the apertured plates mate with these alignment features.

Referring to FIG. 9A, there is shown, from a bottom view (that is, viewed from the gas emission side) an alternate arrangement that can be used for delivery assembly 150 using a stack of vertically disposed plates or superposed apertured plates that are disposed perpendicularly with respect to output face 36. For simplicity of explanation, the portion of delivery assembly 150 shown in the "vertical" embodiment of FIG. 9A has two elongated emissive channels 152 and two elongated exhaust channels 154. The vertical plates arrangement of FIGS. 9-A through 13C can be readily expanded to provide a number of emissive and exhaust elongated channels. With apertured plates disposed perpendicularly with respect to the plane of output face 36, as in FIGS. 9A and 9B, each elongated emissive channel 152 is formed by having side walls defined by separator plates, shown subsequently in more detail, with a reactant plate centered between them. Proper alignment of apertures then provides fluid communication with the supply of gaseous material.

Figure 9C:
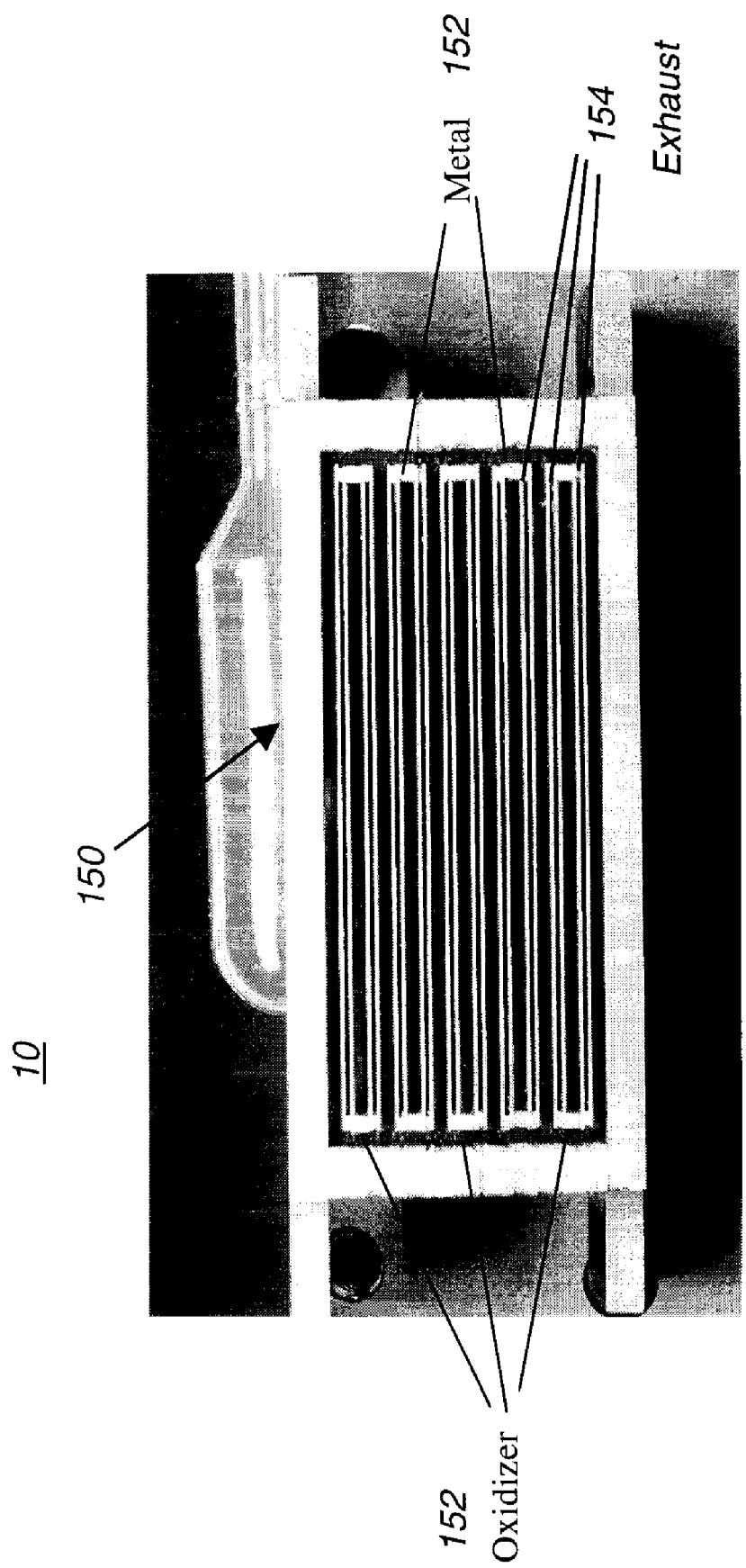
FIG. 9C is a plan view showing a delivery assembly formed using stacked plates.

The exploded view of FIG. 9B shows the arrangement of apertured plates used to form the small section of delivery assembly 150 that is shown in FIG. 9A. FIG. 9C is a plan view showing a delivery assembly 150 having five channels for emitted gases and formed using stacked apertured plates. FIGS. 10A through 13B then show the various plates in both plan and perspective views. For simplicity, letter designations are given to each type of apertured plate: Separator S, Purge P, Reactant R, and Exhaust E.

Figure 11A:
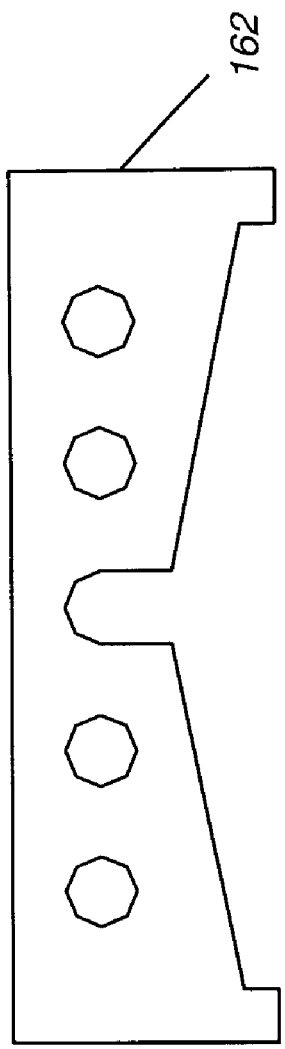
FIGS. 11A and 11B are plan and perspective views, respectively, of a purge plate used in the vertical plate embodiment of FIG. 9A.
Figure 11B:
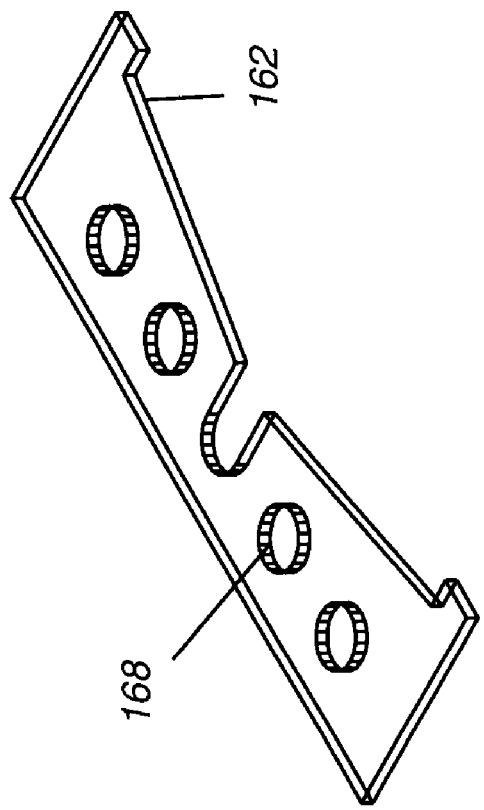
Figure 12A:
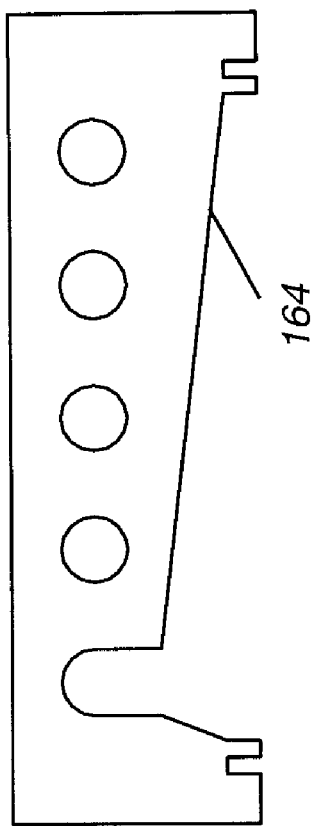
FIGS. 12A and 12B are plan and perspective views, respectively, of an exhaust plate used in the vertical plate embodiment of FIG. 9A.
Figure 12B:
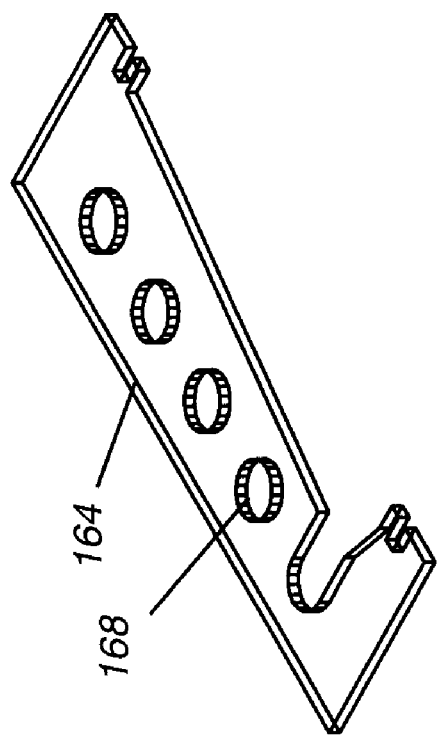
Figure 13A:
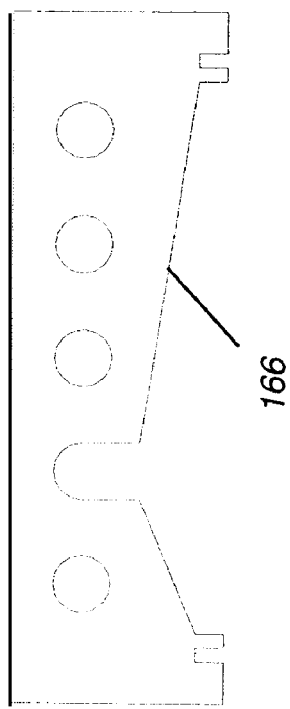
FIGS. 13A and 13B are plan and perspective views, respectively, of a reactant plate used in the vertical plate embodiment of FIG. 9A.
Figure 13B:
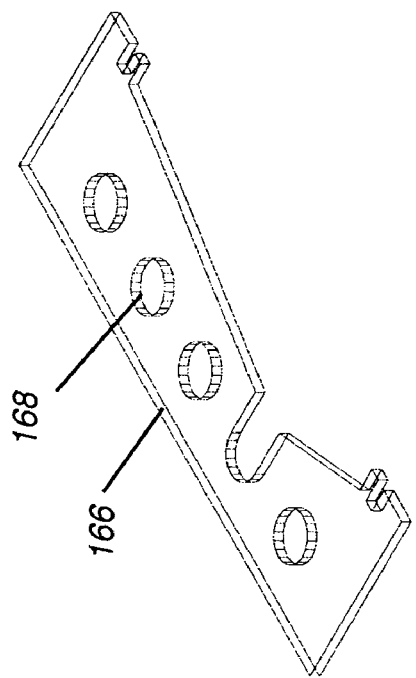
Figure 13C:
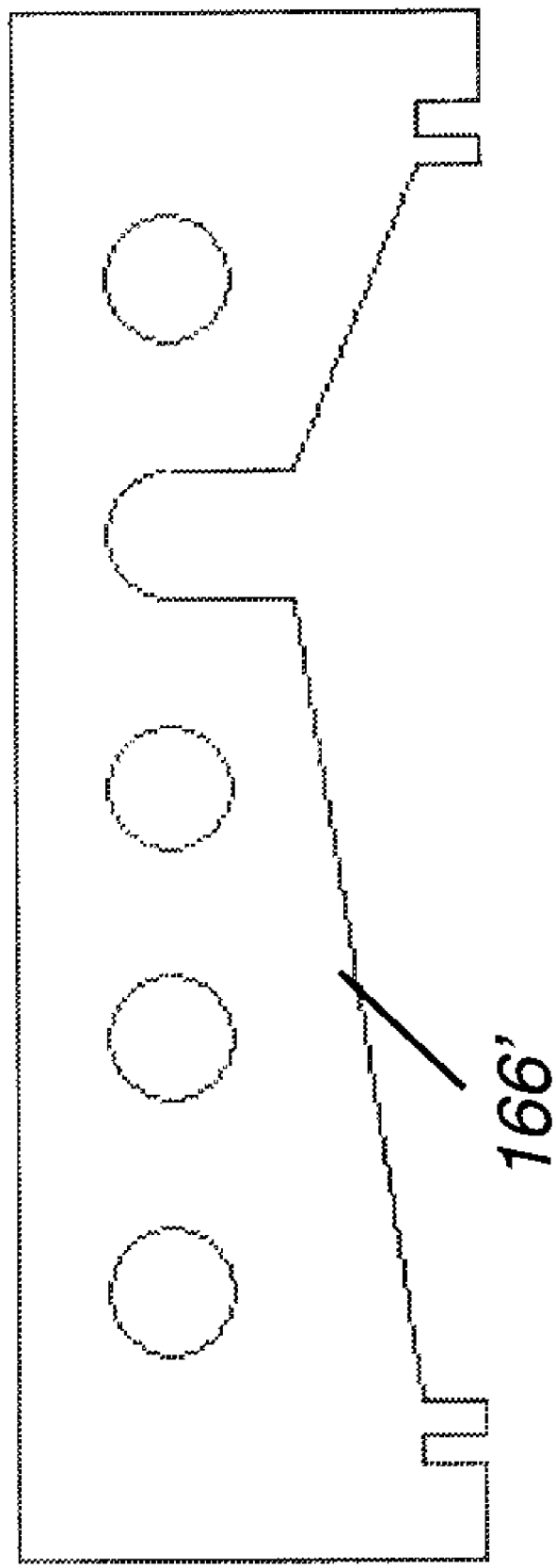
FIG. 13C is a plan view of a reactant plate in an alternate orientation.

From left to right in FIG. 9B are separator plates 160 (S), also shown in FIGS. 10A and 10B, alternating between plates used for directing gas toward or away from the substrate. A purge plate 162 (P) is shown in FIGS. 11A and 11B. An exhaust plate 164 (E) is shown in FIGS. 12A and 12B. A reactant plate 166 (R) is shown in FIGS. 13A and 13B. FIG. 13C shows a reactant plate 166' obtained by flipping the reactant plate 166 of FIG. 12A horizontally; this alternate orientation can also be used with exhaust plate 164, as required. Apertures 168 in each of the plates align when the plates are superposed, thus forming ducts to enable gas to be passed through delivery assembly 150 into elongated emissive output channels 152 and elongated exhaust channels 154, as were described with reference to FIG. 1. (The term "superposed" or "superposition" has its conventional meaning, wherein elements are laid atop or against one another in such manner that parts of one element align with corresponding parts of another and that their perimeters generally coincide.)

Returning to FIG. 9B, only a portion of a delivery assembly 150 is shown. The plate structure of this portion can be represented using the letter abbreviations assigned earlier, that is:

S-P-S-E-S-R-S-E-S (With the last separator plate in this sequence not shown in FIG. 9A or 9B.) As this sequence shows, separator plates 160 (S) define each channel by forming side walls. A minimal delivery assembly 150 for providing two reactive gases along with the necessary purge gases and exhaust channels for a typical ALD deposition would be represented using the full abbreviation sequence:

S-P-S-E1-S-R1-S-E1-S-P-S-E2-S-R2-S-E2-S-P-S-E1-S-R1-S-E1-S-P-S-E2-S-R2-S-E2-S-P-S-E1-S-R1-S-E1-S-P-S where R1 and R2 represent reactant plates 166 in different orientations, for the two different reactant gases used, and E1 and E2 correspondingly represent exhaust plates 164 in different orientations.

Elongated exhaust channel 154 need not be a vacuum port, in the conventional sense, but may simply be provided to draw off the flow in its corresponding output channel 12, thus facilitating a uniform flow pattern within the channel. A negative draw, just slightly less than the opposite of the gas pressure at neighboring elongated emissive channels 152, can help to facilitate an orderly flow. The negative draw can, for example, operate with draw pressure at the source (for example, a vacuum pump) of between 0.2 and 1.0 atmosphere, whereas a typical vacuum is, for example, below 0.1 atmosphere.

Use of the flow pattern provided by delivery head 10 provides a number of advantages over conventional approaches, such as those noted earlier in the background section, that pulse gases individually to a deposition chamber. Mobility of the deposition apparatus improves, and the device of the present invention is suited to high-volume deposition applications in which the substrate dimensions exceed the size of the deposition head. Flow dynamics are also improved over earlier approaches.

The flow arrangement used in the present invention allows a very small distance D between delivery head 10 and substrate 20, as was shown in FIG. 1, preferably under 1 mm. Output face 36 can be positioned very closely, to within about 1 mil (approximately 0.025 mm) of the substrate surface. The close positioning is facilitated by the gas pressure generated by the reactant gas flows. By comparison, CVD apparatus requires significantly larger separation distances. Earlier approaches such as that described in the U.S. Pat. No. 6,821,563 to Yudovsky, cited earlier, were limited to 0.5 mm or greater distance to the substrate surface, whereas embodiments of the present invention can be practice at less than 0.5 mm, for example, less than 0.450 mm. In fact, positioning the delivery head 10 closer to the substrate surface is preferred in the present invention. In a particularly preferred embodiment, distance D from the surface of the substrate can be 0.20 mm or less, preferably less than 100 μm.

It is desirable that when a large number of plates are assembled in a stacked-plate embodiment, the gas flow delivered to the substrate is uniform across all of the channels delivering a gas flow (I, M, or O materials). This can be accomplished by proper design of the apertured plates, such as having restrictions in some part of the flow pattern for each plate which are accurately machined to provide a reproducible pressure drop for each emissive elongated output or exhaust channel. In one embodiment, output channels 12 exhibit substantially equivalent pressure along the length of the openings, to within no more than about 10% deviation. Even higher tolerances could be provided, such as allowing no more than about 5% or even as little as 2% deviation.

Although the method using stacked apertured plates is a particularly useful way of constructing a delivery head, there are a number of other methods for building such structures that may be useful in alternate embodiments. For example, the apparatus may be constructed by direct machining of a metal block, or of several metal blocks adhered together. Furthermore, molding techniques involving internal mold features can be employed, as will be understood by the skilled artisan. The apparatus cam also be constructed using any of a number of stereolithography techniques.

Figure 14:
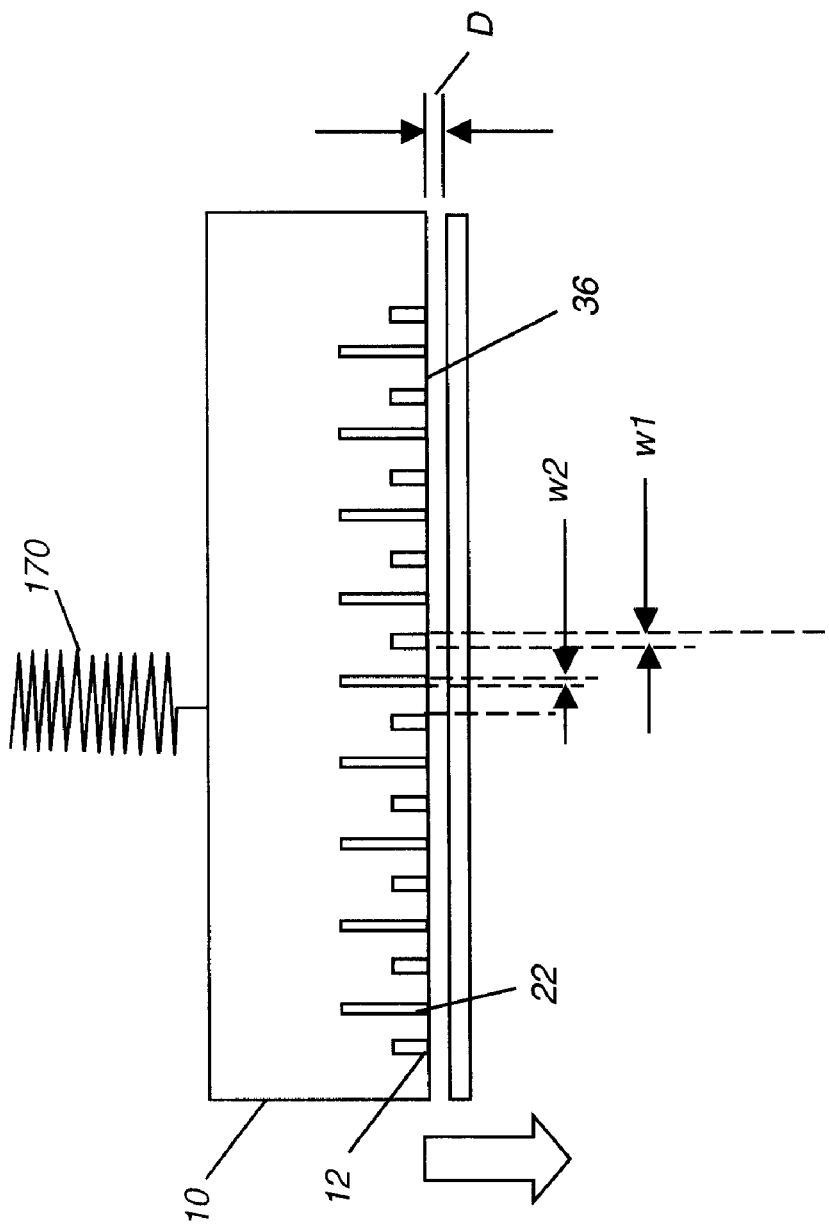
FIG. 14 is a side view of one embodiment of a deposition system comprising a floating delivery head and showing relevant distance dimensions and force directions.

In one embodiment of the invention, the delivery head 10 of the present invention can be maintained a suitable separation distance D (FIG. 1) between its output face 36 and the surface of substrate 20, by using a floating system. FIG. 14 shows some considerations for maintaining distance D using the pressure of gas flows emitted from delivery head 10.

In FIG. 14, a representative number of output channels 12 and exhaust channels 22 are shown. The pressure of emitted gas from one or more of output channels 12 generates a force, as indicated by the downward arrow in this figure. In order for this force to provide a useful cushioning or "air" bearing (fluid gas bearing) effect for delivery head 10, there must be sufficient landing area, that is, solid surface area along output face 36 that can be brought into close contact with the substrate. The percentage of landing area corresponds to the relative amount of solid area of output face 36 that allows build-up of gas pressure beneath it. In simplest terms, the landing area can be computed as the total area of output face 36 minus the total surface area of output channels 12 and exhaust channels 22. This means that total surface area, excluding the gas flow areas of output channels 12, having a width w1, or of exhaust channels 22, having a width w2, must be maximized as much as possible. A landing area of 95% is provided in one embodiment. Other embodiments may use smaller landing area values, such as 85% or 75%, for example. Adjustment of gas flow rate could also be used in order to alter the separation or cushioning force and thus change distance D accordingly.

It can be appreciated that there would be advantages to providing an fluid gas bearing, so that delivery head 10 is substantially maintained at a distance D above substrate 20. This would allow essentially frictionless motion of delivery head 10 using any suitable type of transport mechanism. Delivery head 10 could then be caused to "hover" above the surface of substrate 20 as it is channeled back and forth, sweeping across the surface of substrate 20 during materials deposition.

As shown in FIG. 14, delivery head 10 may be too heavy, so that the downward gas force is not sufficient for maintaining the needed separation. In such a case, auxiliary lifting components, such as a spring 170, magnet, or other device, could be used to supplement the lifting force. In other cases, gas flow may be high enough to cause the opposite problem, so that delivery head 10 would be forced apart from the surface of substrate 20 by too great a distance, unless additional force is exerted. In such a case, spring 170 may be a compression spring, to provide the additional needed force to maintain distance D (downward with respect to the arrangement of FIG. 14). Alternately, spring 170 may be a magnet, elastomeric spring, or some other device that supplements the downward force.

Figure 20:
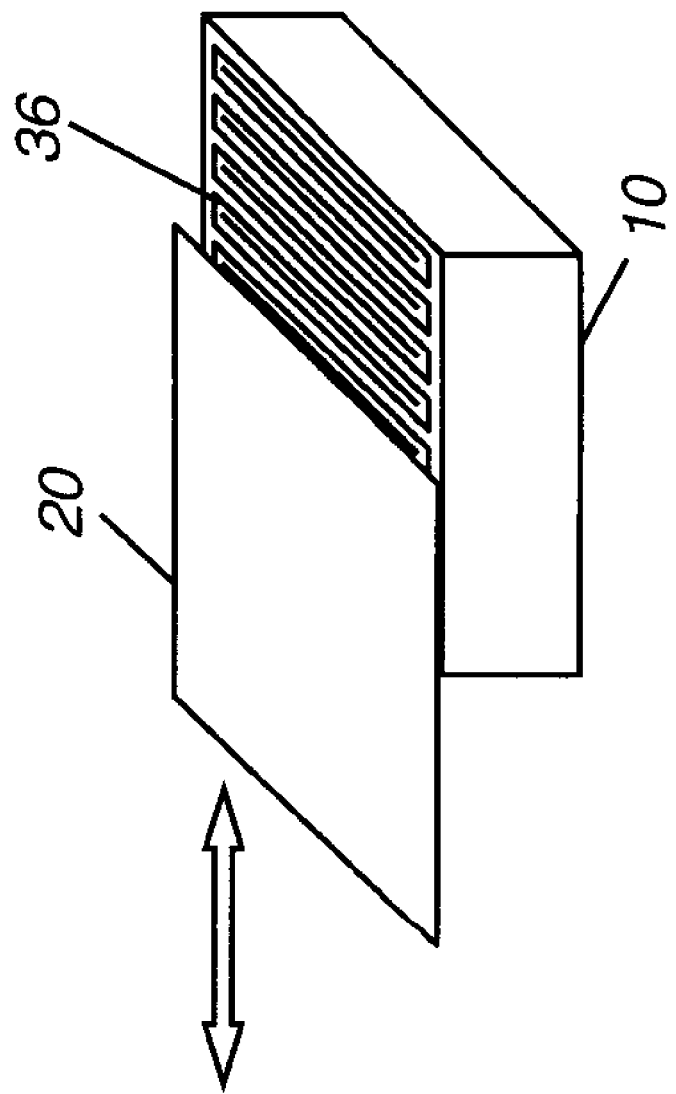
FIG. 20 is a perspective view of an embodiment using a gas cushion to separate the delivery head from the substrate.

Alternately, delivery head 10 may be positioned in some other orientation with respect to substrate 20. For example, substrate 20 could be supported by the fluid gas bearing effect, opposing gravity, so that substrate 20 can be moved along delivery head 10 during deposition. One embodiment using the fluid gas bearing effect for deposition onto substrate 20, with substrate 20 cushioned above delivery head 10 is shown in FIG. 20. Movement of substrate 20 across output face 36 of delivery head 10 is in a direction along the double arrow as shown.

Figure 21:
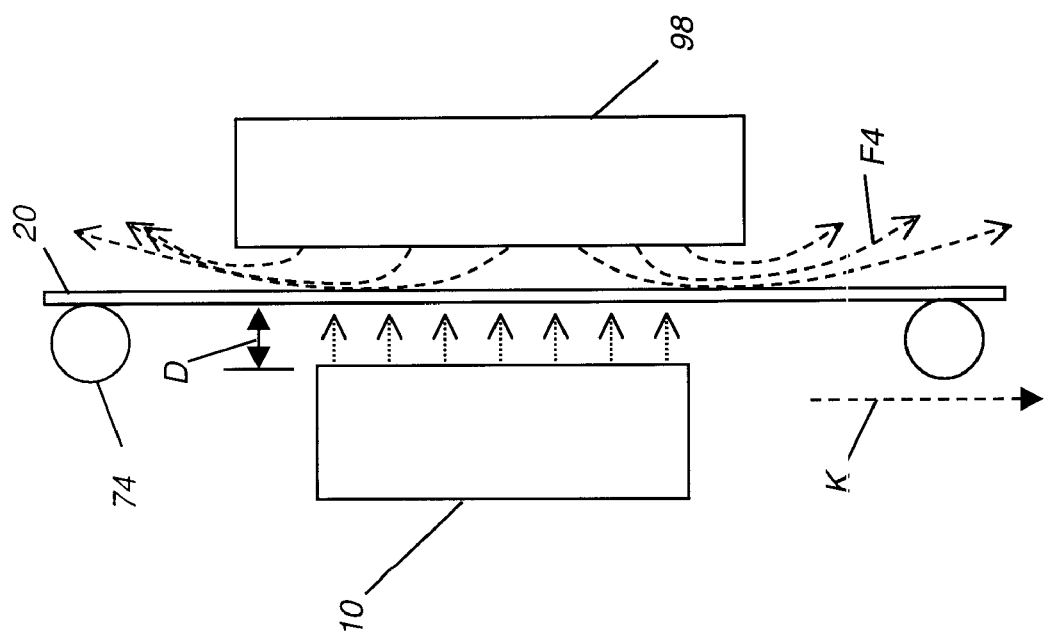
FIG. 21 is a side view showing embodiment for a deposition system comprising a gas fluid bearing for use with a moving substrate.

The alternate embodiment of FIG. 21 shows substrate 20 on a substrate support 74, such as a web support or rollers, moving in direction K between delivery head 10 and a fluid gas bearing 98. In this case, air or another inert gas alone can be used. In this embodiment, delivery head 10 has an air-bearing effect and cooperates with gas fluid bearing 98 in order to maintain the desired distance D between output face 36 and substrate 20. Gas fluid bearing 98 may direct pressure using a flow F4 of inert gas, or air, or some other gaseous material. It is noted that, in the present deposition system, a substrate support or holder can be in contact with the substrate during deposition, which substrate support can be a means for conveying the substrate, for example a roller. Thus, thermal isolation of the substrate being treated is not a requirement of the present system.

As was particularly described with reference to FIGS. 3A and 3B, delivery head 10 requires movement relative to the surface of substrate 20 in order to perform its deposition function. This relative movement can be obtained in a number of ways, including movement of either or both delivery head 10 and substrate 20, such as by movement of an apparatus that provides a substrate support. Movement can be oscillating or reciprocating or could be continuous movement, depending on how many deposition cycles are needed. Rotation of a substrate can also be used, particularly in a batch process, although continuous processes are preferred. An actuator may be coupled to the body of the delivery head, such as mechanically connected. An alternating force, such as a changing magnetic force field, could alternately be used.

Typically, ALD requires multiple deposition cycles, building up a controlled film depth with each cycle. Using the nomenclature for types of gaseous materials given earlier, a single cycle can, for example in a simple design, provide one application of first reactant gaseous material O and one application of second reactant gaseous material M.

The distance between output channels for O and M reactant gaseous materials determines the needed distance for reciprocating movement to complete each cycle. For the example delivery head 10 of FIG. 4 may have a nominal channel width of 0.1 inches (2.54 mm) in width between a reactant gas channel outlet and the adjacent purge channel outlet. Therefore, for the reciprocating motion (along the y axis as used herein) to allow all areas of the same surface to see a full ALD cycle, a stroke of at least 0.4 inches (10.2 mm) would be required. For this example, an area of substrate 20 would be exposed to both first reactant gaseous material O and second reactant gaseous material M with movement over this distance. Alternatively, a delivery head can move much larger distances for its stroke, even moving from one end of a substrate to another. In this case the growing film may be exposed to ambient conditions during periods of its growth, causing no ill effects in many circumstances of use. In some cases, consideration for uniformity may require a measure of randomness to the amount of reciprocating motion in each cycle, such as to reduce edge effects or build-up along the extremes of reciprocation travel.

A delivery head 10 may have only enough output channels 12 to provide a single cycle. Alternately, delivery head 10 may have an arrangement of multiple cycles, enabling it to cover a larger deposition area or enabling its reciprocating motion over a distance that allows two or more deposition cycles in one traversal of the reciprocating motion distance.

For example, in one particular application, it was found that each O-M cycle formed a layer of one atomic diameter over about ¼ of the treated surface. Thus, four cycles, in this case, are needed to form a uniform layer of 1 atomic diameter over the treated surface. Similarly, to form a uniform layer of 10 atomic diameters in this case, then, 40 cycles would be required.

Figure 15:
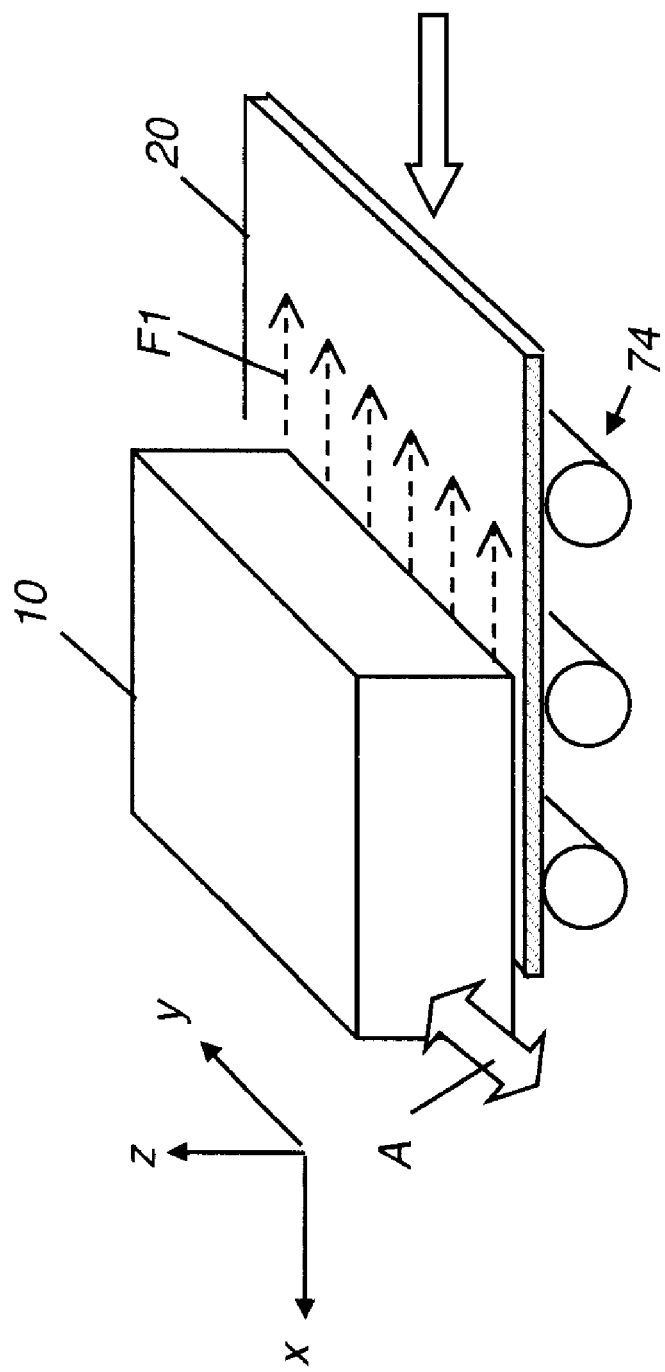
FIG. 15 is a perspective view showing a distribution head used with a substrate transport system.

An advantage of the reciprocating motion used for a delivery head 10 of the present invention is that it allows deposition onto a substrate 20 whose area exceeds the area of output face 36. FIG. 15 shows schematically how this broader area coverage can be effected, using reciprocating motion along the y axis as shown by arrow A and also movement orthogonal or transverse to the reciprocating motion, relative to the x axis. Again, it must be emphasized that motion in either the x or y direction, as shown in FIG. 15, can be effected either by movement of delivery head 10, or by movement of substrate 20 provided with a substrate support 74 that provides movement, or by movement of both delivery head 10 and substrate 20.

In FIG. 15 the relative motion directions of the delivery head, which can comprise a distribution manifold, and the substrate are perpendicular to each other. It is also possible to have this relative motion in parallel. In this case, the relative motion needs to have a nonzero frequency component that represents the oscillation and a zero frequency component that represents the displacement of the substrate. This combination can be achieved by: an oscillation combined with displacement of the delivery head over a fixed substrate; an oscillation combined with displacement of the substrate relative to a fixed substrate delivery head; or any combinations wherein the oscillation and fixed motion are provided by movements of both the delivery head and the substrate.

Advantageously, delivery head 10 can be fabricated at a smaller size than is possible for many types of deposition heads. For example, in one embodiment, output channel 12 has width w1 of about 0.005 inches (0.127 mm) and is extended in length to about 3 inches (75 mm).

In a preferred embodiment, ALD can be performed at or near atmospheric pressure and over a broad range of ambient and substrate temperatures, preferably at a temperature of under 300° C. Preferably, a relatively clean environment is needed to minimize the likelihood of contamination; however, full "clean room" conditions or an inert gas-filled enclosure would not be required for obtaining good performance when using preferred embodiments of the apparatus of the present invention.

Figure 16:
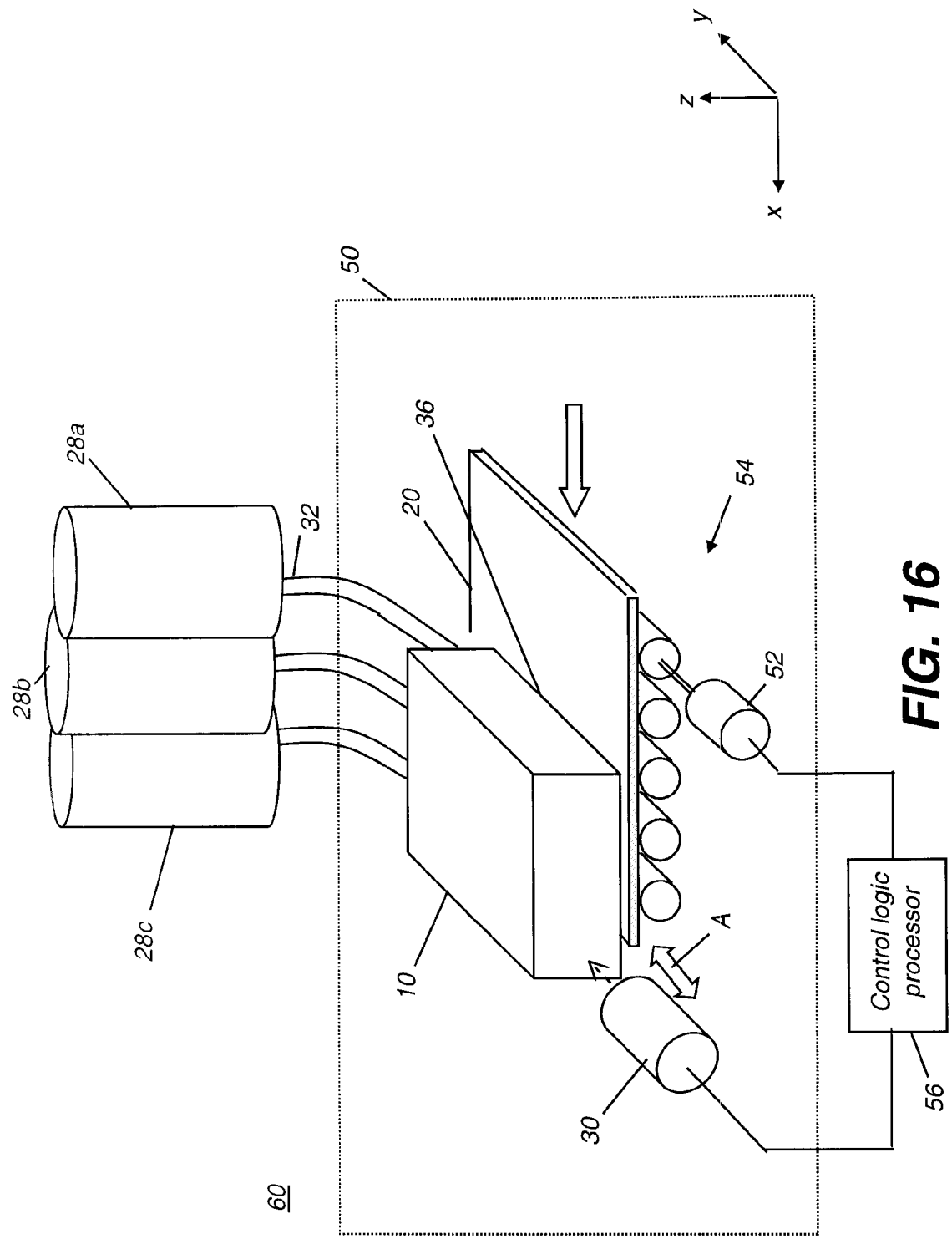
FIG. 16 is a perspective view showing a deposition system using the delivery head of the present invention.

FIG. 16 shows an Atomic Layer Deposition (ALD) system 60 having a chamber 50 for providing a relatively well-controlled and contaminant-free environment. Gas supplies 28a, 28b, and 28c provide the first, second, and third gaseous materials to delivery head 10 through supply lines 32. The optional use of flexible supply lines 32 facilitates ease of movement of delivery head 10. For simplicity, optional vacuum vapor recovery apparatus and other support components are not shown in FIG. 16 but could also be used. A transport subsystem 54 provides a substrate support that conveys substrate 20 along output face 36 of delivery head 10, providing movement in the x direction, using the coordinate axis system employed in the present disclosure. Motion control, as well as overall control of valves and other supporting components, can be provided by a control logic processor 56, such as a computer or dedicated microprocessor assembly, for example. In the arrangement of FIG. 16, control logic processor 56 controls an actuator 30 for providing reciprocating motion to delivery head 10 and also controls a transport motor 52 of transport subsystem 54. Actuator 30 can be any of a number of devices suitable for causing back-and-forth motion of delivery head 10 along a moving substrate 20 (or, alternately, along a stationary substrate 20).

Figure 17:
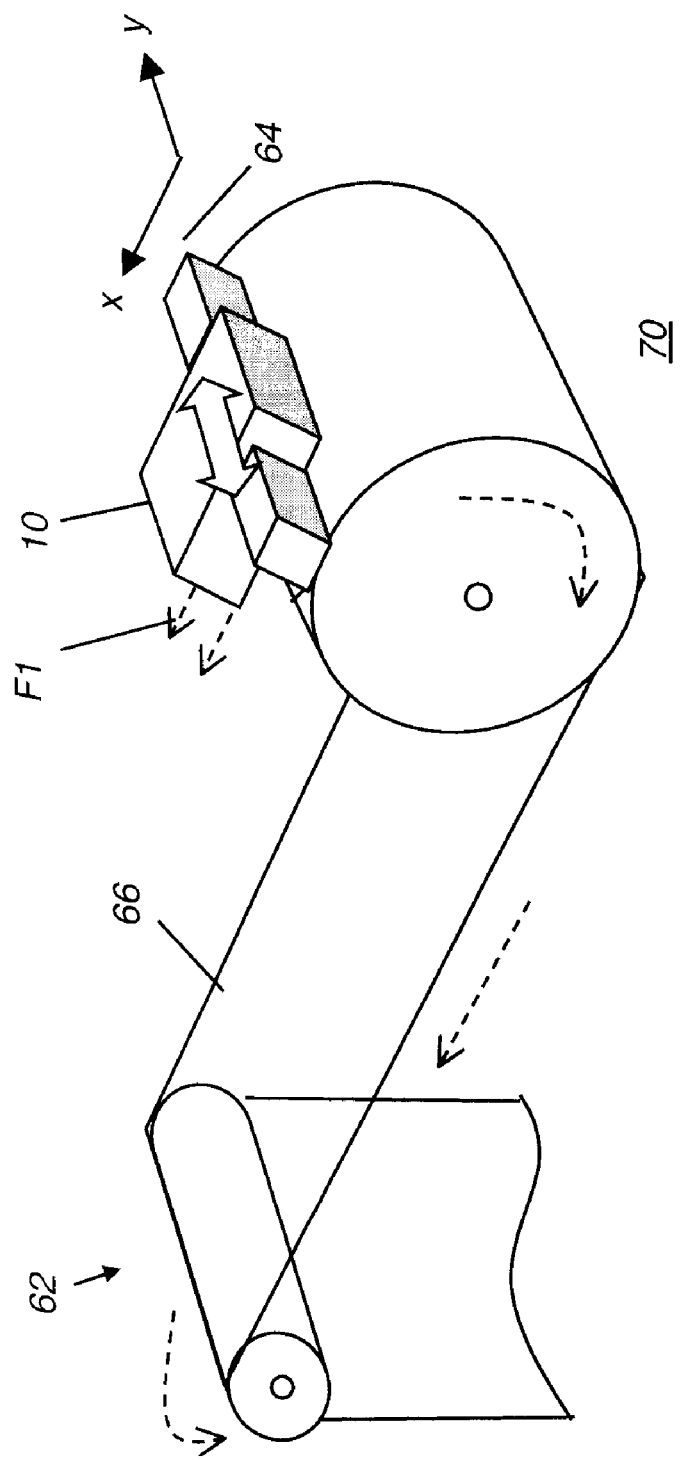
FIG. 17 is a perspective view shoeing one embodiment of a deposition system applied to a moving web.

FIG. 17 shows an alternate embodiment of an Atomic Layer Deposition (ALD) system 70 for thin film deposition onto a web substrate 66 that is conveyed past delivery head 10 along a web conveyor 62 that acts as a substrate support. The web itself may be the substrate being treated or may provide support for a substrate, either another web or separate substrates, for example, wafers. A delivery head transport 64 conveys delivery head 10 across the surface of web substrate 66 in a direction transverse to the web travel direction. In one embodiment, delivery head 10 is impelled back and forth across the surface of web substrate 66, with the full separation force provided by gas pressure. In another embodiment, delivery head transport 64 uses a lead screw or similar mechanism that traverses the width of web substrate 66. In another embodiment, multiple delivery heads 10 are used, at suitable positions along web conveyor 62.

Figure 18:
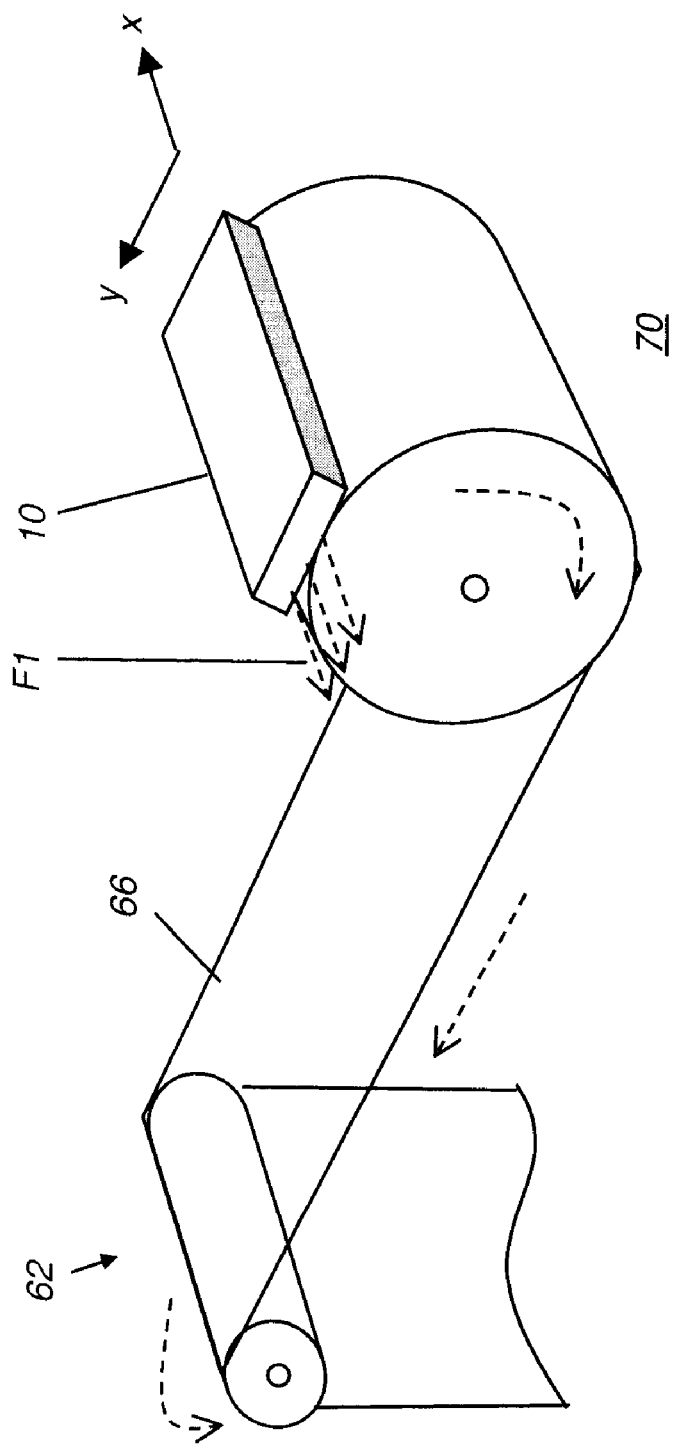
FIG. 18 is a perspective view showing another embodiment of deposition system applied to a moving web.
Figure 19:
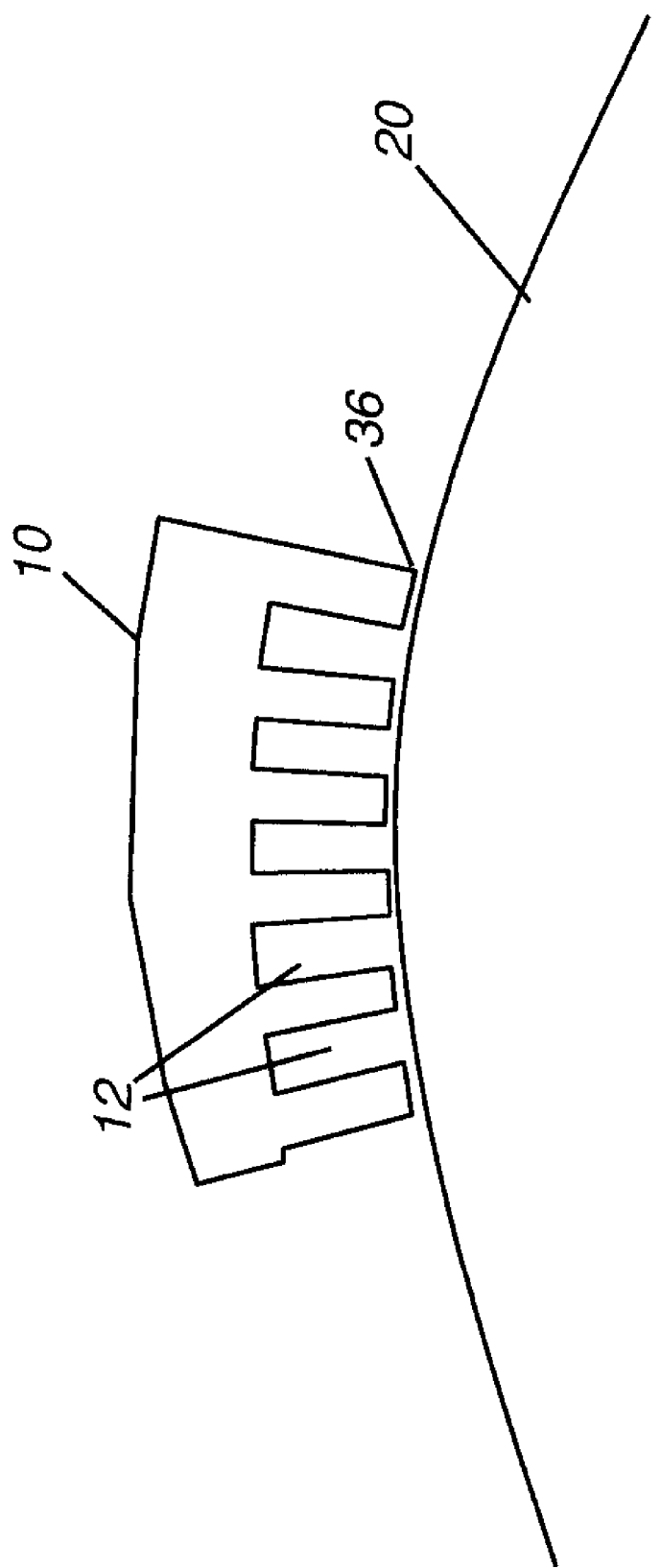
FIG. 19 is a cross-sectional side view of one embodiment of a delivery head with an output face having curvature.

FIG. 18 shows another Atomic Layer Deposition (ALD) system 70 in a web arrangement, using a stationary delivery head 10 in which the flow patterns are oriented orthogonally to the configuration of FIG. 17. In this arrangement, motion of web conveyor 62 itself provides the movement needed for ALD deposition. Reciprocating motion could also be used in this environment. Referring to FIG. 19, an embodiment of a portion of delivery head 10 is shown in which output face 36 has an amount of curvature, which might be advantageous for some web coating applications. Convex or concave curvature could be provided.

In another embodiment that can be particularly useful for web fabrication, ALD system 70 can have multiple delivery heads 10, or dual delivery heads 10, with one disposed on each side of web substrate 66. A flexible delivery head 10 could alternately be provided. This would provide a deposition apparatus that exhibits at least some conformance to the deposition surface.

In still another embodiment, one or more output channels 12 of delivery head 10 may use the transverse gas flow arrangement that was disclosed in U.S. application Ser. No. 11/392,006, filed Mar. 29, 2006 by Levy et al. and entitled "APPARATUS FOR ATOMIC LAYER DEPOSITION," cited earlier and incorporated herein by reference. In such an embodiment, gas pressure that supports separation between delivery head 10 and substrate 20 can be maintained by some number of output channels 12, such as by those channels that emit purge gas (channels labeled I in FIGS. 2-3B), for example. Transverse flow would then be used for one or more output channels 12 that emit the reactant gases (channels labeled O or M in FIGS. 2-3B).

The apparatus of the present invention is advantaged in its capability to perform deposition onto a substrate over a broad range of temperatures, including room or near-room temperature in some embodiments. The apparatus of the present invention can operate in a vacuum environment, but is particularly well suited for operation at or near atmospheric pressure.

Thin film transistors having a semiconductor film made according to the present method can exhibit a field effect electron mobility that is greater than 0.01 $cm^2/Vs$, preferably at least 0.1 $cm^2/Vs$, more preferably greater than 0.2 $cm^2/Vs$. In addition, n-channel thin film transistors having semiconductor films made according to the present invention are capable of providing on/off ratios of at least $10^4$, advantageously at least $10^5$. The on/off ratio is measured as the maximum/minimum of the drain current as the gate voltage is swept from one value to another that are representative of relevant voltages which might be used on the gate line of a display. A typical set of values would be −10V to 40V with the drain voltage maintained at 30V.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. For example, while air bearing effects may be used to at least partially separate delivery head 10 from the surface of substrate 20, the apparatus of the present invention may alternately be used to lift or levitate substrate 20 from output surface 36 of delivery head 10. Other types of substrate holder could alternately be used, including a platen for example.

EXAMPLE 1

A mechanical gas diffusing element according to the embodiment of FIG. 8D was constructed. In this element, the 130 micron thick nozzle plate contained 50 micron holes at a spacing of 1000 microns. The mixing chamber was composed of an additional 130 thick micron plate in which existed chamber openings of 460 microns. Finally, the gas was allowed to exit through and additional 130 thick micron plate in which were cut 100 micron exit slots.

The diffuser plate was mounted to a fixture to allow a flow to be presented to the nozzle arrangement. The cumulative area of flow for this setup, as defined by the area between exit slots, was $9.03 \times 10^{-4}$ $m^2$. A total volumetric flow of $5.46 \times 10^{-5}$ $m^3/s$ of nitrogen (density=1.14 $kg/m^3$) was flowed through the device, leading to a gas velocity of 0.06 m/s. With this gas velocity, a pressure drop of 2760 Pa was measured across the diffuser. Pressure was measured with a commercially available digital pressure transducer/gauge (obtained from Omega). Since the definition of a friction factor relates it to the force exerted by the flow on the gas diffuser, the measured pressure drop is in terms of force/area, not the force directly. The friction factor f was calculated to be $1.3 \times 10^6$.

Using an APALD device according to the embodiment of FIG. 4 comprising this mechanical gas diffusing element, a film of $Al_2O_3$ was grown on a silicon wafer, according to the present invention. The APALD device was configured to have 11 output channels in a configuration as follows:

| | |
|---|---|
| Channel 1: | Purge Gas |
| Channel 2: | Oxidizer containing gas |
| Channel 3: | Purge Gas |
| Channel 4: | Metal precursor containing gas |
| Channel 5: | Purge Gas |
| Channel 6: | Oxidizer containing gas |
| Channel 7: | Purge Gas |
| Channel 8: | Metal precursor containing gas |
| Channel 9: | Purge Gas |
| Channel 10: | Oxidizer containing gas |
| Channel 11: | Purge Gas |

The film was grown at a substrate temperature of 150° C. Gas flows delivered to the APALD coating head were as follows:

(i) A nitrogen inert purge gas was supplied to channels 1, 3, 5, 7, 9, and 11 at a total flow rate of 3000 sccm.

(ii) A nitrogen based gas stream containing trimethylaluminum was supplied to channels 4 and 8. This gas stream was produced by mixing a flow of ~400 sccm of pure nitrogen with a flow of 3.5 sccm of nitrogen saturated with TMA at room temperature.

(iii) A nitrogen based gas stream containing water vapor was supplied to channels 2, 6, and 10. This gas stream was produced by mixing a flow of ~350 sccm of pure nitrogen with a flow of 20 sccm of nitrogen saturated with water vapor at room temperature.

The coating head with the above gas supply streams was brought into proximity with the substrate and then released, so that it floated above the substrate based upon the gas flows as described earlier. At this point, the coating head was oscillated for 300 cycles across the substrate to yield an $Al_2O_3$ film of approximately 900 Å thickness.

A current leakage test structure was formed by coating aluminum contact pads on top of the $Al_2O_3$ layer using a shadow mask during an aluminum evaporation. This process resulted in aluminum contact pads on top of the $Al_2O_3$ that were approximately 500 Å thick with an area of 500 microns× 200 microns.

The leakage current from the silicon wafer to the Al contacts was measured by applying a 20V potential between a given aluminum contact pad to the silicon wafer and measuring the amount the current flow with an HP-4155C® parameter analyzer. At a 20 V potential, the leakage through the $Al_2O_3$ dielectric was $1.3 \times 10^{-11}$ A. As can be seen from this test data, the coating head of this example produces a film with advantageously low current leakage, which is desired for the production of useful dielectric films.

EXAMPLE 2

Instead of the mechanical gas diffusing element of Example 1, a 0.2 micron pore porous alumina membrane can be used. A commercially available alumina porous membrane containing 0.2 micron pores was purchased from Whatman Incorporated. The active area of the membrane was 19 mm in diameter and was mounted in a pressure filter holder through which was passed nitrogen gas at room temperature. The cumulative area of flow for this setup, as defined by the area of the 19 mm diameter circle, was $2.83 \times 10^{-4}$ m². A total volumetric flow of $1.82 \times 10^5$ m³/s of nitrogen (density=1.14 kg/m³) was flowed through the device, leading to a gas velocity of 0.06 m/s. With this gas velocity, a pressure drop of 22690 Pa was measured across the diffuser. The friction factor f was calculated to be $9.6 \times 10^6$.

EXAMPLE 3

Instead of the mechanical gas diffusing element of Example 1, a 0.02 micron pore porous alumina membrane can be used. A commercially available alumina porous membrane containing 0.02 micron pores was purchased from Whatman Incorporated. The active area of the membrane was 19 mm in diameter and was mounted in a pressure filter holder through which was passed gas at room temperature. The cumulative area of flow for this setup, as defined by the area of the 19 mm diameter circle, was $2.83 \times 10^{-4}$ m². A total volumetric flow of $1.82 \times 10^5$ m³/s of nitrogen (density=1.14 kg/m³) was flowed through the device, leading to a gas velocity of 0.06 m/s. With this gas velocity, a pressure drop of 54830 Pa was measured across the plate. The friction factor f was calculated to be $2.3 \times 10^7$.

COMPARATE EXAMPLE 4

Instead of the mechanical gas diffusing element of Example 1, the friction factor or a metal screen with 150 micron perforations was determined. A commercially available metal screen was obtained from the McMaster Carr company. The screen was 250 microns thick, with 150 micron circular perforations. The perforations were spaced at 300 microns on center in a hexagonal pattern. This screen represents a fairly small hole size for commercially available metal screens.

A piece of screen was mounted in a holder with gas allowed to pass through a square cross section of the screen measuring 1.5 mm×2.3 mm. A total volumetric flow of $1.82 \times 10^{-5}$ m³/s of nitrogen (density=1.14 kg/m³) was flowed through the device, leading to a gas velocity of 5.27 m/s. With this gas velocity, a pressure drop of 480 Pa was measured across the screen. The friction factor f was calculated to be $3.0 \times 10^1$.

A larger velocity of gas flow was used for this measurement due to the fact that this screen had a very low friction factor and needed a high gas velocity in order to produce a measurable pressure drop. The low friction factor produced by this screen, despite the fact that it is of a design that should provide some resistance to flow, indicates that this screen by itself could not provide a friction factor greater than $1 \times 10^2$.

PARTS LIST

10 delivery head
12 output channel
14, 16, 18 gas inlet conduit
20 substrate
22 exhaust channel
24 exhaust conduit
28a, 28b, 28c gas supply
30 actuator
32 supply line
36 output face
50 chamber
52 transport motor
54 transport subsystem
56 control logic processor
60 Atomic Layer Deposition (ALD) system
62 web conveyor
64 delivery head transport
66 web substrate
70 Atomic Layer Deposition (ALD) system
74 substrate support
90 directing channel for precursor material
91 exhaust directing channel
92 directing channel for purge gas
96 substrate support
98 gas fluid bearing
100 connection plate
102 directing chamber
104 input port
110 gas chamber plate
112, 113, 115, supply chamber
114, 116 exhaust chamber
120 gas direction plate
122 directing channel for precursor material
123 exhaust directing channel
130 base plate
132 elongated emissive channel
134 elongated exhaust channel
140 gas diffuser unit
142 nozzle plate 143, 147, 149 first, second, third diffuser passages
146 gas diffuser plate
148 face plate
150 delivery assembly
152 elongated emissive channel
154 elongated exhaust channel
160 separator plate
162 purge plate
164 exhaust plate
166, 166' reactant plate
168 aperture
170 spring
180 sequential first exhaust slot
182 sequential second exhaust slot
184 sequential third exhaust slot
A arrow
D distance
E Exhaust plate
F1, F2, F3, F4 gas flow
I third inert gaseous material
K direction
M second reactant gaseous material
O first reactant gaseous material
P purge plate
R reactant plate
S separator plate
w1, w2 channel width
X arrow

The invention claimed is:

1. A delivery device for thin-film material deposition onto a substrate comprising: (a) a plurality of inlet ports comprising at least a first inlet port, a second inlet port, and a third inlet port capable of receiving a common supply for a first gaseous material, a second gaseous material, and a third gaseous material, respectively; (b) at least one exhaust port capable of receiving exhaust gas from thin-film material deposition and at least two elongated exhaust channels, each of the elongated exhaust channels capable of gaseous fluid communication with the at least one exhaust port; (c) at least three groups of elongated emissive channels, (i) a first group comprising one or more first elongated emissive channels, (ii) a second group comprising one or more second elongated emissive channels, and (iii) a third group comprising at least two third elongated emissive channels, each of the first, second, and third elongated emissive channels capable of gaseous fluid communication, respectively unmixed, with one of the corresponding first inlet port, second inlet port, and third inlet port; wherein each of the first, second, and third elongated emissive channels and each of the elongated exhaust channels extend in a length direction substantially in parallel; wherein each first elongated emissive channel is separated on at least one elongated side thereof from a nearest second elongated emissive channel by a relatively nearer elongated exhaust channel and a relatively less near third elongated emissive channel; wherein each first elongated emissive channel and each second elongated emissive channel is situated between relatively nearer elongated exhaust channels and between relatively less nearer elongated emissive channels; (d) a gas diffuser associated with at least one group of the three groups of elongated emissive channels such that at least one of the first, second, and third gaseous material, respectively, is capable of passing through the gas diffuser prior to delivery from the delivery device to the substrate, during thin-film material deposition onto the substrate, and wherein the gas diffuser maintains flow isolation of the at least one of first, second, and third gaseous material downstream from each of the elongated emissive channels in the at least one group of elongated emissive channels; wherein the gas diffuser is capable of providing a friction factor that is greater than $1 \times 10^2$, assuming a representative gas that is nitrogen at 25° C. and a representative average velocity between 0.01 and 0.5 m/sec of gaseous material passing through the gas diffuser.

2. The delivery device of claim 1 wherein the gas diffuser is associated with each of the three groups of elongated emissive channels such that each of the first, second, and third gaseous material, respectively, is capable of separately passing from the delivery device to the substrate during thin-film material deposition on the substrate, and wherein the gas diffuser maintains flow isolation of each of first, second, and third gaseous material downstream from each of the elongated emissive channels in the three groups of elongated emissive channels.

3. The delivery device of claim 2 wherein the gas diffuser is a mechanical assembly housing separate flow paths associated with each of the first elongated emissive channels, separate flow paths associated with each of the second elongated emissive channels, and separate flow paths associated with each of the third elongated emissive channels.

4. The delivery device of claim 1 wherein the gas diffuser occupies at least a portion of each of the individual elongated emissive channels in the at least one of the three groups of elongated emissive channels.

5. The delivery device of claim 1 wherein the gas diffuser element is capable of providing a friction factor that is between $1 \times 10^4$ to $1 \times 10^8$.

6. The delivery device of claim 1 wherein there are at least two second elongated emissive channels and wherein each first elongated emissive channel is separated on both elongated sides thereof from the nearest second elongated emissive channel by a relatively nearer elongated exhaust channel and a relatively less near third elongated emissive channel.

7. The delivery device of claim 1 wherein there are a plurality of second elongated emissive channels and a plurality of first elongated emissive channels; wherein each first elongated emissive channel is separated on both elongated sides thereof from the nearest second elongated emissive channel by a relatively nearer elongated exhaust channel and a relatively less near third elongated emissive channel; and wherein each second elongated emissive channel is separated on both elongated sides thereof from the nearest first elongated emissive channel by a relatively nearer elongated exhaust channel and a relatively less near third elongated emissive channel.

8. The delivery device of claim 7 wherein the delivery device comprises an additional first or second elongated emissive channel at each of two ends of the delivery head that does not have, on one side thereof, a second or first elongated emissive channel, respectively, on the side closest to an edge of an output face of the delivery device.

9. The delivery device of claim 2 wherein the gas diffuser is a unit that is designed to be separable from a delivery assembly, comprising the rest of the delivery device, and that substantially covers the most downstream flow passages of the delivery assembly for the first, second, and third gaseous material.

10. The delivery device of claim 1 wherein the gas diffuser is designed to be an inseparable part of the delivery device.

11. The delivery device of claim 1 wherein the gas diffuser comprises a mechanically formed assembly comprising interconnected openings in at least two elements, thereby providing the required friction factor.

12. The delivery device of claim 11 wherein the at least two elements are steel, and the interconnected openings are formed by molding, mechanical machining, or laser or lithographic techniques.

13. The delivery device of claim 2 wherein for each individual first, second, and third elongated emissive channel, the gas diffuser comprises at least two vertically overlying passages, respectively, in at least two vertically arranged gas-diffuser plates, in combination providing a flow path for gaseous material that comprises two substantially vertical flow paths separated by a substantially horizontal flow path, wherein the substantially vertical flow path is provided by passages, or components of passages, extending in an elongated direction parallel to corresponding elongated emissive channels, and wherein the substantially horizontal flow path is provided by a relatively thin space between parallel surface areas in parallel gas diffuser plates, wherein vertical refers to the orthogonal direction with respect to an output face of the delivery device.

14. The delivery device of claim 13 wherein the at least two vertically arranged gas diffuser plates have substantially horizontally extending surfaces on each side and form substantially flat, stacked apertured plates.

15. The delivery device of claim 13 wherein the gas diffuser comprises at least three vertically overlying sets of passages, respectively, in at least three vertically arranged gas diffuser plates, wherein the relatively thin space is defined by a thickness of a central gas diffuser plate situated between two substantially parallel gas diffuser plates.

16. The delivery device of claim 1 wherein the gas diffuser is a multilevel system comprising a series of at least three substantially horizontally extending gas diffuser plates with substantially parallel surfaces facing each other in an orthogonal direction with respect to an output face of the delivery device, each of said gas diffuser plates having a plurality of flow passages each in gaseous communication with one of the individual elongated emissive channels among the first, second, and third elongated emissive channels; wherein the plurality of passages in at least two of the gas diffuser plates, a sequential first and third diffuser plate, extends in an elongated direction, and wherein the each of the plurality of passages in the first gas diffuser plate is horizontally offset, in a direction perpendicular to the length of the elongated direction, with respect to the each of the plurality of passages in the third diffuser plates that is in gaseous fluid communication therewith; wherein a sequentially second gas diffuser plate positioned between the first and third diffuser plate comprises a plurality of elongated center openings each of which is relatively broader than the width of the corresponding passages in flow communication thereof in each of the first and the third second diffuser plates, such that each elongated center opening is defined by two elongated sides and from the vertical direction contains within its borders the horizontally offset passages, of the first diffuser component and the third diffuser plate, in flow communication therewith; and whereby the gas diffuser is capable of substantially deflecting flow of gaseous material passing therethrough.

17. The delivery device of claim 11 wherein the gas diffuser unit is capable of deflecting flow at an angle of 45 to 135 degrees, such that orthogonal flow is changed to a parallel flow with respect to a surface of an output face of the delivery device.

18. The delivery device of claim 11 wherein the gas diffuser sequentially provides (i) flow of gaseous material substantially vertical through the one or more passages, or components of passages in the at least two elements, and (ii) flow of gaseous material substantially horizontally in a narrow space formed between substantially parallel surface areas of the at least two elements, wherein the narrow space in vertical cross-section forms an elongated channel parallel to an associated elongated emissive channel, wherein vertical means perpendicular with respect to an output face of the delivery device and horizontal means parallel with respect to the output face of the delivery device.

19. The delivery device of claim 16 wherein the passages in the first gas diffuser plate comprises a plurality of individual sets of perforations extending along an elongated line, wherein each individual set of perforations is in gaseous flow communication with one of the passages in the second gas diffuser plate.

20. The delivery device of claim 1 wherein each of the elongated emissive channels in at least one group of the three groups of elongated emissive channels are designed to provide at least one of the first, second, and third gaseous material indirectly to the substrate after passing through a porous material that is either (i) within each individual emissive elongated channel among the at least one group of elongated emissive channels and/or (ii) upstream of each individual emissive elongated channel among the at least one group of elongated emissive channels.

21. The delivery device of claim 20 in which the porous material comprises pores that are formed by a chemical transformation or present in a naturally occurring porous material.

22. The delivery device of claim 21 wherein the porous material comprises pores that are less than 10,000 nm in average diameter, which volume is substantially available for flow of gaseous material.

23. The delivery device of claim 20 wherein the porous material comprises pores formed from the interstitial space between particles or pores that are interconnected voids in a solid material formed by a voiding agent.

24. The delivery device of claim 20 wherein the porous material is formed from microfibers.

25. The delivery device of claim 20 wherein the porous material comprises an isolating, non-connecting pores structure in which pores are substantially vertical to the surface.

26. The delivery device of claim 20 wherein the porous material is an alumina material made from anodized aluminum.

27. The delivery device of claim 20 wherein the porous material comprises one or more layers of different porous materials or a layer of porous material supported by a perforated sheet, which layers are optionally separated by spacer elements.

28. The delivery device of claim 20 wherein the porous material comprises a layer that is 5 to 1000 micrometers thick.

29. The delivery device of claim 20 wherein the porous material is formed from the interstitial space between inorganic or organic particles which is held together by bonding.

30. The delivery device of claim 20 wherein the porous material results from the processing of a polymer film to generate porosity.

31. The delivery device of claim 20 wherein the porous material is in the form of at least one horizontally disposed layer that covers the face of the delivery device.

32. The delivery device of claim 20 wherein the porous material forms a continuous layer, optionally with passages mechanically formed therein.

33. The delivery device of claim 32 wherein the mechanically formed openings are elongated channels for the relatively unimpeded flow of exhaust gaseous material back through the delivery device.

34. The delivery device of claim 20 wherein the layer of porous material is in the form of a substantially continuous plate in a stack of plates.

35. The delivery device of claim 20 wherein the gas diffuser is an assembly of elements in which porous material is held in separate confined areas.

36. The delivery device of claim 20 wherein the porous material is introduced or formed inside elongated channels, wherein the elongated channels are at least partially filled by the porous material.

37. The delivery device of claim 36 wherein the elongated channels are elongated channels in a steel plate in which particles are introduced and then sintered to form a gas diffuser element or portion thereof.

38. A delivery device for thin-film material deposition onto a substrate comprising: (a) a plurality of inlet ports comprising at least a first inlet port, a second inlet port, and a third inlet port capable of receiving a common supply for a first gaseous material, a second gaseous material, and a third gaseous material, respectively; (b) at least one exhaust port capable of receiving exhaust gas from thin-film material deposition and at least two elongated exhaust channels, each of the elongated exhaust channels capable of gaseous fluid communication with the at least one exhaust port; (c) at least three groups of elongated emissive channels, (i) a first group comprising one or more first elongated emissive channels, (ii) a second group comprising one or more second elongated emissive channels, and (iii) a third group comprising at least two third elongated emissive channels, each of the first, second, and third elongated emissive channels capable of gaseous fluid communication, respectively unmixed, with one of the corresponding first inlet port, second inlet port, and third inlet port; wherein each of the first, second, and third elongated emissive channels and each of the elongated exhaust channels extend in a length direction substantially in parallel; wherein each first elongated emissive channel is separated on at least one elongated side thereof from a nearest second elongated emissive channel by a relatively nearer elongated exhaust channel and a relatively less near third elongated emissive channel; wherein each first elongated emissive channel and each second elongated emissive channel is situated between relatively nearer elongated exhaust channels and between relatively less nearer elongated emissive channels; (d) a gas diffuser associated with at least one group of the three groups of elongated emissive channels such that at least one of the first, second, and third gaseous material, respectively, is capable of passing through the gas diffuser prior to delivery from the delivery device to the substrate, during thin-film material deposition onto the substrate, and wherein the gas diffuser maintains flow isolation of the at least one of first, second, and third gaseous material downstream from each of the elongated emissive channels in the at least one group of elongated emissive channels; wherein the gas diffuser comprises a porous material through which the at least one of the first, the second, and the third gaseous material passes.

39. A delivery device for thin-film material deposition onto a substrate comprising: (a) a plurality of inlet ports comprising at least a first inlet port, a second inlet port, and a third inlet port capable of receiving a common supply for a first gaseous material, a second gaseous material, and a third gaseous material, respectively; (b) at least one exhaust port capable of receiving exhaust gas from thin-film material deposition and at least two elongated exhaust channels, each of the elongated exhaust channels capable of gaseous fluid communication with the at least one exhaust port; (c) at least three groups of elongated emissive channels, (i) a first group comprising one or more first elongated emissive channels, (ii) a second group comprising one or more second elongated emissive channels, and (iii) a third group comprising at least two third elongated emissive channels, each of the first, second, and third elongated emissive channels capable of gaseous fluid communication, respectively unmixed, with one of the corresponding first inlet port, second inlet port, and third inlet port; wherein each of the first, second, and third elongated emissive channels and each of the elongated exhaust channels extend in a length direction substantially in parallel; wherein each first elongated emissive channel is separated on at least one elongated side thereof from a nearest second elongated emissive channel by a relatively nearer elongated exhaust channel and a relatively less near third elongated emissive channel; wherein each first elongated emissive channel and each second elongated emissive channel is situated between relatively nearer elongated exhaust channels and between relatively less nearer elongated emissive channels; (d) a gas diffuser associated with at least one group of the three groups of elongated emissive channels such that at least one of the first, second, and third gaseous material, respectively, is capable of passing through the gas diffuser prior to delivery from the delivery device to the substrate, during thin-film material deposition onto the substrate, and wherein the gas diffuser maintains flow isolation of the at least one of first, second, and third gaseous material downstream from each of the elongated emissive channels in the at least one group of elongated emissive channels; wherein the gas diffuser comprises a mechanically formed assembly comprising a series of at least two elements, each element comprising a substantially parallel surface area facing each other; wherein at least one element comprises a plurality of perforations extending in an elongated direction, wherein each plurality of perforations is associated with the flow from one of the each elongated emissive channels in the at least one group of elongated emissive channels; and wherein the gas diffuser deflects gaseous material passing from each of the plurality of perforations into a thin space between the parallel surface areas in the two elements.

40. A deposition system wherein the delivery device of claim 1 is capable of providing thin film deposition of a solid material onto a substrate in a system in which a substantially uniform distance is maintained between an output face of the delivery head and the substrate surface during thin film deposition.

41. The deposition system of claim 40 wherein pressures generated due to flow of one or more of the gaseous materials from the delivery head to the substrate surface for thin film deposition provides at least part of the force separating the output face of the delivery head from the surface of the substrate.

42. The deposition system of claim 40 wherein a substrate support is a moving web and/or the substrate is a moving web.

43. The deposition system of claim 40 wherein the substrate support maintains the substrate surface at a separation distance of within 0.4 mm of the output face of the delivery head.

44. The deposition system of claim 42 wherein movement of the web provided by the transport apparatus is continuous, optionally reciprocating.

45. The deposition system of claim 40 wherein the substrate and the delivery head are open to the atmosphere.

46. The deposition system of claim 40 wherein gas flows are provided through substantially parallel elongated openings on the output face of the delivery head, which are substantially straight or substantially concentric.

47. The deposition system of claim 40 wherein the substantially uniform distance maintained between the output face of the delivery head and the substrate is less than 1 mm.

* * * * *